US011678531B2

(12) United States Patent
Hwang

(10) Patent No.: US 11,678,531 B2
(45) Date of Patent: Jun. 13, 2023

(54) DISPLAY DEVICE

(71) Applicant: SAMSUNG DISPLAY CO., LTD., Yongin-si (KR)

(72) Inventor: Se Ja Chul Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/649,001

(22) Filed: Jul. 13, 2017

(65) Prior Publication Data

US 2018/0102402 A1 Apr. 12, 2018

(30) Foreign Application Priority Data

Oct. 6, 2016 (KR) .................. 10-2016-0129229

(51) Int. Cl.
| | |
|---|---|
| *H01L 27/32* | (2006.01) |
| *G09G 3/3233* | (2016.01) |
| *H01L 51/00* | (2006.01) |
| *G09G 3/3266* | (2016.01) |
| *G09G 3/3275* | (2016.01) |

(52) U.S. Cl.
CPC ....... *H01L 27/3276* (2013.01); *G09G 3/3233* (2013.01); *H01L 27/3279* (2013.01); *H01L 51/0097* (2013.01); *G09G 3/3266* (2013.01); *G09G 3/3275* (2013.01); *G09G 2310/08* (2013.01); *G09G 2320/0233* (2013.01); (Continued)

(58) Field of Classification Search
None
See application file for complete search history.

(56) References Cited

U.S. PATENT DOCUMENTS

| 8,766,271 B2 | 7/2014 | Kim et al. |
| 9,269,756 B2 | 2/2016 | Jung |
| | (Continued) | |

FOREIGN PATENT DOCUMENTS

| CN | 103094306 A | 5/2013 |
| CN | 104241295 A | 12/2014 |
| | (Continued) | |

OTHER PUBLICATIONS

Extended European Search Report for Application No. 17189751.5 dated Mar. 1, 2018.

*Primary Examiner* — Benjamin C Lee
*Assistant Examiner* — Emily J Frank
(74) *Attorney, Agent, or Firm* — Cantor Colburn LLP

(57) ABSTRACT

A display device includes a substrate including a display region and a non-display region including sub-non-display regions extending from sides of the display region and separated from each other, a display layer provided on a surface of the substrate in the display region and including pixels, and wiring lines provided in the sub-non-display regions on the substrate and electrically connected to the pixels. The sub-non-display regions each includes a display connection region connected to the display region and at least one extension region extending from a part of the display connection region. The sub-non-display regions are bent and are disposed on a surface opposite to a surface, on which the display layer is disposed, in the display region. When the sub-non-display regions are bent, an extension region of one of the sub-non-display regions overlaps another extension region of another of the sub-non-display regions.

48 Claims, 16 Drawing Sheets

(52) U.S. Cl.
CPC .. *G09G 2330/02* (2013.01); *H01L 2251/5338* (2013.01); *Y02E 10/549* (2013.01)

(56) References Cited

U.S. PATENT DOCUMENTS

| | | | |
|---|---|---|---|
| 9,287,329 B1* | 3/2016 | Lee | H01L 27/124 |
| 9,326,375 B2 | 4/2016 | Lee | |
| 9,430,180 B2 | 8/2016 | Hirakata et al. | |
| 9,564,477 B2 | 2/2017 | Kim | |
| 9,647,233 B2 | 5/2017 | Kim et al. | |
| 9,812,058 B2* | 11/2017 | Masumoto | H05B 33/10 |
| 2006/0256043 A1* | 11/2006 | Hagihara | H01R 12/7076 345/67 |
| 2007/0146246 A1* | 6/2007 | Nakamura | H01L 27/3276 345/76 |
| 2007/0262929 A1* | 11/2007 | Kim | G09G 3/3233 345/76 |
| 2010/0277443 A1* | 11/2010 | Yamazaki | G02F 1/1368 345/204 |
| 2012/0146886 A1* | 6/2012 | Minami | H01L 27/3276 345/80 |
| 2012/0241774 A1* | 9/2012 | Chen | G02F 1/133308 257/88 |
| 2013/0088671 A1* | 4/2013 | Drzaic | G02F 1/13452 349/106 |
| 2013/0161732 A1 | 6/2013 | Hwang et al. | |
| 2014/0002385 A1 | 1/2014 | Ka et al. | |
| 2014/0139771 A1* | 5/2014 | Choi | H01L 27/3276 349/43 |
| 2014/0209360 A1* | 7/2014 | Peng | H05K 1/028 174/254 |
| 2015/0036300 A1* | 2/2015 | Park | G02F 1/1345 361/749 |
| 2015/0091012 A1 | 4/2015 | Namkung et al. | |
| 2015/0305147 A1* | 10/2015 | Tombs | G06F 3/04164 345/174 |
| 2016/0118370 A1* | 4/2016 | Wu | H01L 27/3232 362/19 |
| 2017/0031389 A1* | 2/2017 | Yoo | G06F 3/0443 |
| 2017/0186349 A1* | 6/2017 | Arima | G09G 3/325 |
| 2018/0374422 A1* | 12/2018 | Fujikawa | G09G 3/006 |

FOREIGN PATENT DOCUMENTS

| | | |
|---|---|---|
| CN | 105957874 A | 9/2016 |
| EP | 2993515 A1 | 3/2016 |
| JP | 10115837 A | 5/1998 |
| JP | 2014132319 A | 7/2014 |
| KR | 1020050001936 A | 1/2005 |
| KR | 100658068 B1 | 12/2006 |
| KR | 101243667 B1 | 3/2013 |
| KR | 1020130074954 A | 7/2013 |
| KR | 1020140122597 A | 10/2014 |
| KR | 101484966 B1 | 1/2015 |
| KR | 20150002118 A | 1/2015 |
| KR | 1020150012143 A | 2/2015 |
| TW | 201523872 A | 6/2015 |
| WO | 2010070735 A1 | 6/2010 |

\* cited by examiner

DISPLAY DEVICE

This application claims priority to Korean Patent Application No. 10-2016-0129229, filed on Oct. 6, 2016, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

In general, an organic light emitting display ("OLED") includes a display region including a plurality of pixels, driving circuits for supplying driving signals including scan signals and data signals to the display region, and a power supply circuit for supplying pixel powers to the pixel unit.

When the scan signals are supplied to the plurality of pixels, the plurality of pixels emits light components with brightness components corresponding to the data signals supplied in synchronization with the scan signals.

In addition, in the OLED, the emission brightness components of the plurality of pixels are affected by voltages of the pixel powers. The pixel powers determine the emission brightness components of the plurality of pixels together with the data signals. Therefore, in order for the OLED to display an image with uniform picture quality, the pixel powers having the same voltage with each other are to be supplied to the plurality of pixels.

SUMMARY

Exemplary embodiments of the invention relate to a display device capable of displaying an image with uniform picture quality through uniformly supplied pixel powers.

A display device according to an exemplary embodiment of the invention includes a substrate including a display region and a non-display region including a plurality of sub-non-display regions that are extended from sides of the display region and separated from each other, a display layer provided on a surface of the substrate in the display region and including a plurality of pixels, and wiring lines provided in the plurality of sub-non-display regions on the substrate and electrically connected to the plurality of pixels. The plurality of sub-non-display regions each includes a display connection region connected to the display region and at least one extension region extended from a part of the display connection region. The plurality of sub-non-display regions are bent and is face a surface opposite to a surface, on which the display layer is disposed, in the display region. When the plurality of sub-non-display regions is bent, the extension region of one of the plurality of sub-non-display regions overlaps the extension region of another of the plurality of sub-non-display regions adjacent to the one of the plurality of sub-non-display regions.

In an exemplary embodiment, the substrate may have a first surface and second surface facing the first surface, and the display layer and the wiring lines may be provided on the first surface.

In an exemplary embodiment, when the plurality of sub-non-display regions is bent, the second surface of the plurality of sub-non-display regions may face the second surface of the display region.

In an exemplary embodiment, the display connection region may have a trapezoid that includes two lines parallel to each other and two inclined lines connecting ends of the two lines.

In an exemplary embodiment, a width of a region close to the display area may be larger than a width of a region far from the display area in the display connection region.

In an exemplary embodiment, a sum of inclined angles of two inclined lines of the display connection regions may be equal to or less than 90°.

In an exemplary embodiment, when the plurality of sub-non-display regions is bent, a sum of an inclined angle of one of two inclined lines of one of the display connection regions and an inclined angle of another of two inclined lines of another of the display connection regions adjacent to the one of the display connection regions may be equal to or less than 90°.

In an exemplary embodiment, when the plurality of sub-non-display regions is bent, the display connection region of the one of the plurality of sub-non-display regions may not overlap the display connection region of the another of the plurality of sub-non-display regions adjacent to the one of the plurality of sub-non-display regions.

In an exemplary embodiment, the display device may further include a connection terminal provided in the extension region and electrically connected to the wiring lines.

In an exemplary embodiment, each of the plurality of sub-non-display regions may include two extension regions separated from each other.

In an exemplary embodiment, the connection terminal of one extension region of overlapping extension regions may face and be electrically connected to the connection terminal of the another extension region of the overlapping extension regions.

In an exemplary embodiment, the connection terminal of the extension region may be provided on a surface, on which the wiring lines are disposed, of the substrate. In an exemplary embodiment, the connection terminal of the another extension region may be provided on a surface opposite to the surface, on which the wiring lines are disposed, of the substrate.

In an exemplary embodiment, the connection terminal of the another extension region may be electrically connected to the wiring lines through a contact hole that passes through the substrate.

In an exemplary embodiment, the connection terminal of each of the overlapping extension regions may be provided on a surface, on which the wiring lines are disposed, of the substrate. In an exemplary embodiment, the extension region may be bent. In an exemplary embodiment, the connection terminal of the extension region may face and be electrically connected to the connection terminal of another extension region.

In an exemplary embodiment, the extension region may include a housing covering the connection terminal and providing an internal space. In an exemplary embodiment, the another extension region may be inserted into the internal space.

In an exemplary embodiment, the display device may further include a conductive member disposed among the connection terminals and including one of an anisotropic conductive film ("ACF") and an anisotropic conductive adhesive ("ACA").

In an exemplary embodiment, wiring lines of the plurality of sub-non-display regions adjacent to each other may be electrically connected.

In an exemplary embodiment, the display device further may include a circuit board connected to at least one of the plurality of sub-non-display regions and applying a signal to the wiring lines.

In an exemplary embodiment, the signal may be pixel power supplied to the plurality of pixels.

A display device according to an exemplary embodiment of the invention includes a substrate including a display region and a non-display region including a plurality of sub-non-display regions that are extended from sides of the display region and separated from each other, a display layer provided on a surface of the substrate in the display region and including a plurality of pixels, wiring lines provided in the plurality of sub-non-display regions on the substrate and electrically connected to the plurality of pixels, and at least one circuit board connected to at least one of the plurality of sub-non-display regions and applying a signal to the wiring lines. The plurality of sub-non-display regions each includes a display connection region connected to the display region and at least one extension region extended from a part of the display connection region. The plurality of sub-non-display regions may be bent and face a surface opposite to a surface, on which the display layer is disposed, in the display region. When the plurality of sub-non-display regions is bent, the wiring lines are electrically connected.

In an exemplary embodiment, the display device may further include a connection terminal provided in the extension region and electrically connected to the wiring lines. The display connection region is a quadrangle including one side contacting the display region.

In an exemplary embodiment, the extension region may extend from a side that faces the one side of the display connection region.

In an exemplary embodiment, the connection terminal may be directly connected to the circuit board.

In an exemplary embodiment, the plurality of sub-non-display regions each may include two extension regions respectively extending from sides contacting both ends of the one side of the display connection region.

In an exemplary embodiment, the display region may be a quadrangle. In an exemplary embodiment, the non-display region may include a first sub-non-display region, a second sub-non-display region, a third sub-non-display region, and a fourth sub-non-display region respectively extending from sides of the display region. In an exemplary embodiment, the first sub-non-display region may include the two extension regions connected to the circuit board and respectively extending from sides contacting both ends of the one side of the display connection region. In an exemplary embodiment, the third sub-non-display region may include the at least one extension region facing the first sub-non-display region and extending from a side facing the one side of the display connection region connected to the circuit board. In an exemplary embodiment, the extension region of the third sub-non-display region may be connected to the circuit board.

In an exemplary embodiment, when the plurality of sub-non-display regions is bent, the second sub-non-display region and the fourth sub-non-display region may overlap one of the extension regions of the first sub-non-display region.

The above-described display device may supply uniform pixel powers to the plurality of pixels of the display region. Therefore, the display device may display an image with uniform picture quality.

In addition, in the display device, since the non-display region is bent toward a rear surface of the display region, it is possible to minimize an exposed area of the non-display region.

BRIEF DESCRIPTION OF THE DRAWINGS

Example embodiments will now be described more fully hereinafter with reference to the accompanying drawings; however, they may be embodied in different forms and should not be construed as limited to the exemplary embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
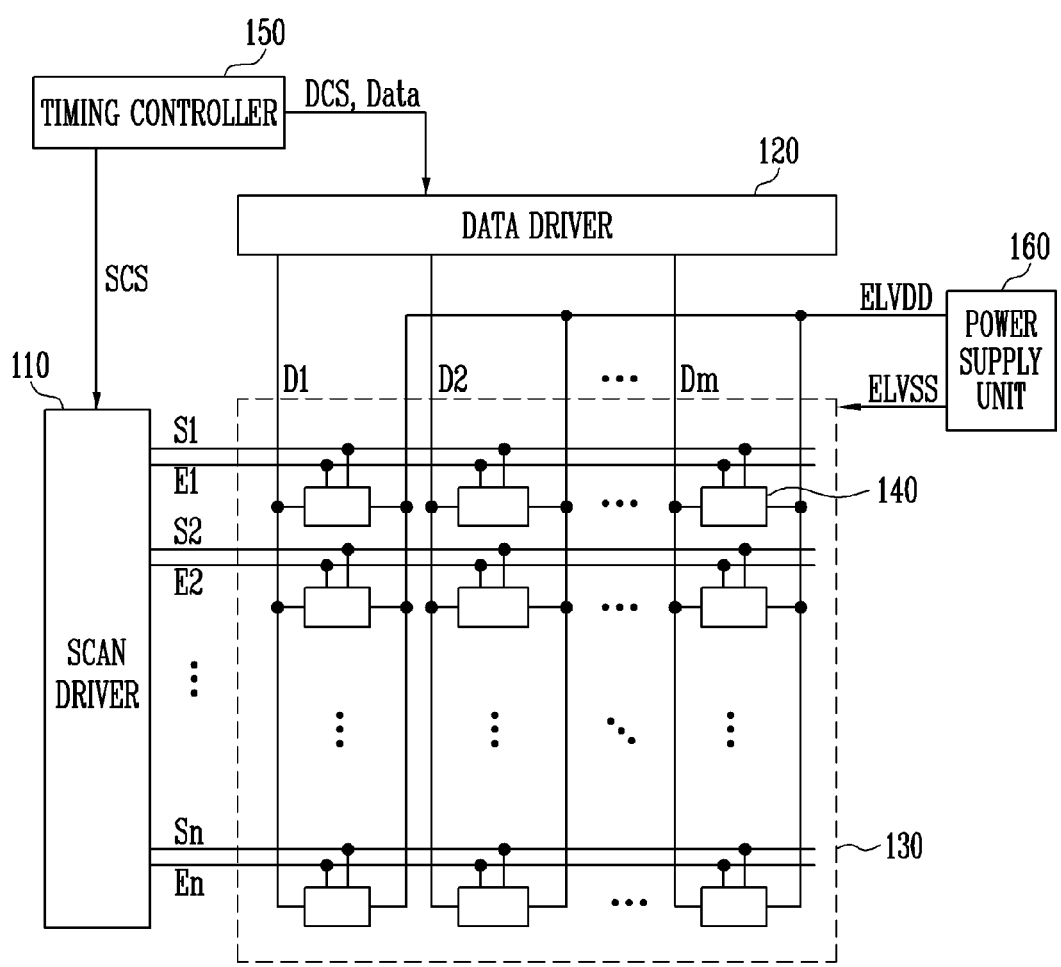
FIG. 1 is a block diagram illustrating an exemplary embodiment of a display device according to the invention.

The invention may be modified variably and may have various embodiments, particular examples of which will be illustrated in drawings and described in detail. However, it is to be understood that the invention is not limited to a specific disclosed form, but includes all modifications, equivalents, and substitutions without departing from the scope and spirit of the invention.

In describing drawings, like numbers refer to like elements. In the accompanying drawings, dimensions of structures are exaggerated to clarify the invention. While terms such as "first" and "second," etc., may be used to describe various components, such components must not be understood as being limited to the above terms. The above terms are used only to distinguish one component from another. For example, a first component may be referred to as a second component without departing from the scope of rights of the invention, and likewise a second component may be referred to as a first component. As used herein, the singular forms "a", "an" and "the" are intended to include the plural forms as well, unless the context clearly indicates otherwise.

In the application, it is to be understood that the terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added. In addition, it will be understood that when an element such as a layer, film, region, or substrate is referred to as being "on" another element, it can be directly on the other element or intervening elements may also be present. Conversely, it will be understood that when an element such as a layer, film, region, or substrate is referred to as being "beneath" another element, it can be directly on the other element or intervening elements may also be present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, an exemplary embodiment of the invention will be described with reference to the accompanying drawings.

FIG. 1 is a block diagram illustrating a display device according to an exemplary embodiment of the invention.

Referring to FIG. 1, the display device may include a pixel unit 130 including pixels 140 connected to scan lines S1 through Sn, emission control lines E1 through En (where n is a natural number greater than 1), and data lines D1 through Dm (where m is a natural number greater than 1), a scan driver 110 for driving the scan lines S1 through Sn and the emission control lines E1 through En, a data driver 120 for driving the data lines D1 through Dm, a timing controller 150 for controlling the scan driver 110 and the data driver 120, and a power supply unit 160 for supplying power to the pixels 140.

The timing controller 150 may generate a data driving control signal DCS and a scan driving control signal SCS in response to synchronizing signals supplied from the outside. The data driving control signal DCS generated by the timing controller 150 is supplied to the data driver 120 and the scan driving control signal SCS may be supplied to the scan driver 110. The timing controller 150 realigns data supplied from the outside and may supply the realigned data to the data driver 120.

Start pulses and first clock signals may be included in the scan driving control signal SCS. The start pulses may control first timings of scan signals and emission control signals. The first clock signals may be used for shifting the start pulses.

A source start pulse and second clock signals may be included in the data driving control signal DCS. The source start pulse may control a sampling start point of time of the data. The second clock signals may be used for controlling a sampling operation.

The scan driver 110 may receive the scan driving control signal SCS from the timing controller 150. The scan driver 110 that receives the scan driving control signal SCS may supply the scan signals to the scan lines S1 through Sn. In an exemplary embodiment, the scan driver 110 may sequentially supply the scan signals to the scan lines S1 through Sn, for example. When the scan signals are sequentially supplied to the scan lines S1 through Sn, the pixels 140 may be selected in units of horizontal lines.

In addition, the scan driver 110 that receives the scan driving control signal SCS may supply the emission control signals to the emission control lines E1 through En. In an exemplary embodiment, the scan driver 110 may sequentially supply the emission control signals to the emission control lines E1 through En, for example. The emission control signals may be used for controlling emission times of the pixels 140. For this purpose, the emission control signals may be set to have larger widths than the scan signals. In an exemplary embodiment, the scan driver 110 may supply the scan signals to an (i−1)th scan line and an ith scan line so as to overlap the emission control signal supplied to an ith (i is a natural number equal to or greater than 2) emission control line, for example.

The scan driver 110 may be disposed (e.g., mounted) on a substrate through a thin film process. In addition, the scan driver 110 may be positioned at both sides with the pixel unit 130 interposed.

In addition, in FIG. 1, the scan driver 110 is illustrated as supplying the scan signals and the emission control signals. However, the invention is not limited thereto. In an exemplary embodiment, the display device further includes an emission control driver (not shown), the scan driver 110 supplies the scan signals, and the emission control driver may supply the emission control signals, for example.

In addition, the emission control signals may be set to have a gate off voltage (for example, a high voltage) at which transistors included in the pixels 140 may be turned off and the scan signals may be set to have a gate on voltage (for example, a low voltage) at which the transistors included in the pixels 140 may be turned on.

The data driver 120 may supply the data signals to the data lines D1 through Dm in response to the data driving control signal DCS. The data signals supplied to the data lines D1 through Dm may be supplied to the pixels 140 selected by the scan signals. For this purpose, the data driver 120 may supply the data signals to the data lines D1 through Dm in synchronization with the scan signals.

The pixel unit 130 may include the pixels 140 connected to the scan lines S1 through Sn, the emission control lines E1 through En, and the data lines D1 through Dm. The pixels 140 may receive a first pixel power ELVDD and a second pixel power ELVSS from the outside.

Each of the pixels 140 may include a driving transistor and an organic light emitting diode ("OLED") that are not shown. The driving transistor may control an amount of current that flows from the first pixel power ELVDD to the second pixel power ELVSS via the OLED to correspond to the data signal.

In FIG. 1, the n scan lines S1 through Sn and the n emission control lines E1 through En are illustrated. However, the invention is not limited thereto. In an exemplary embodiment, to correspond to a circuit structure of the pixels 140, the pixels 140 positioned on an ith horizontal line may be additionally connected to a scan line (for example, an (i−1)th scan line) positioned on a previous horizontal line, for example. For this purpose, dummy scan lines and/or dummy emission control lines that are not shown may be additionally disposed in the pixel unit 130.

The power supply unit 160 may generate the first pixel power ELVDD and the second pixel power ELVSS by using external power supplied from an external power supply device (not shown). The power supply unit 160 for generating the first pixel power ELVDD and the second pixel power ELVSS may supply the first pixel power ELVDD and the second pixel power ELVSS to the pixels 140 of the pixel unit 130.

Figure 2:
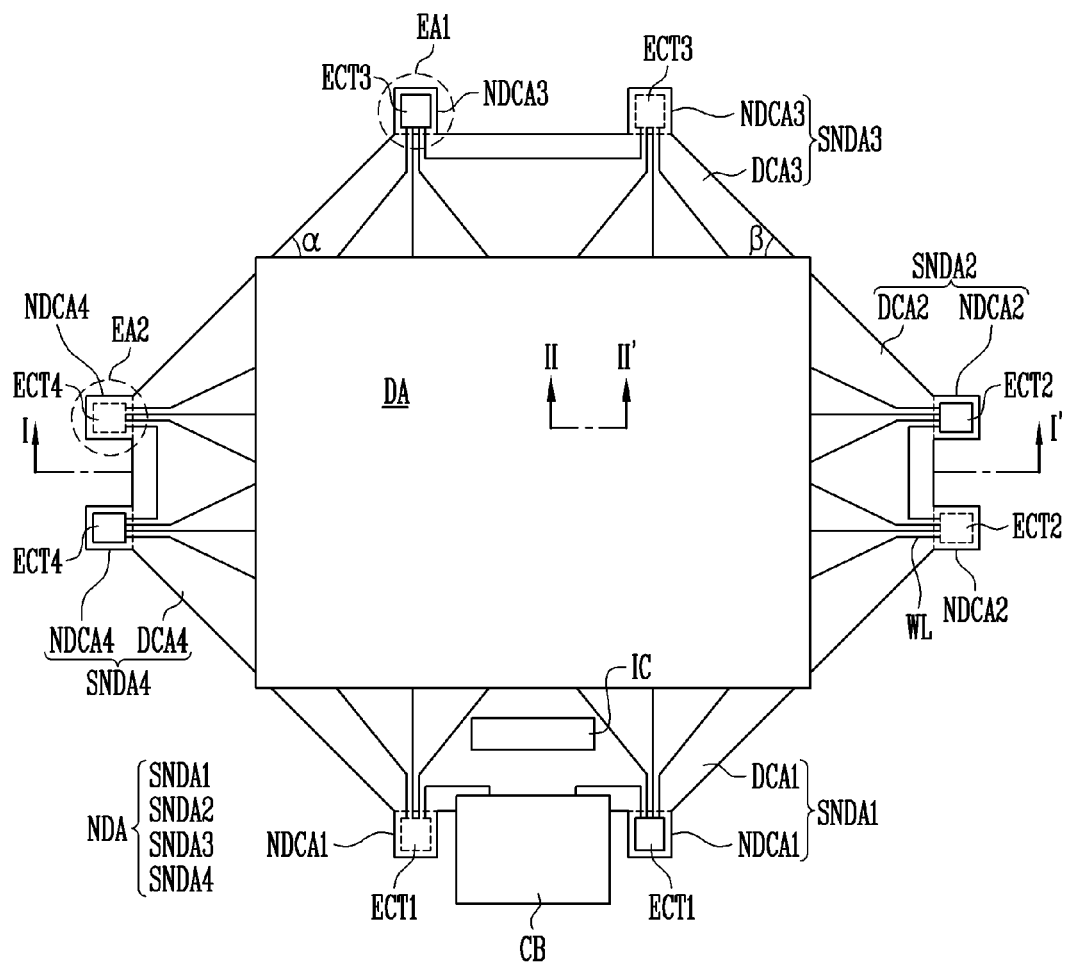
FIG. 2 is a plan view illustrating an exemplary embodiment of a display device according to the invention.
Figure 3:
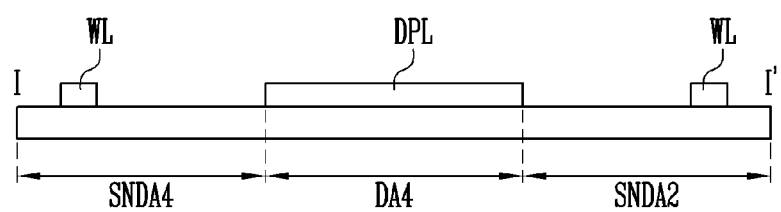
FIG. 3 is a cross-sectional view taken along line I-I' of FIG. 2.
Figure 4:
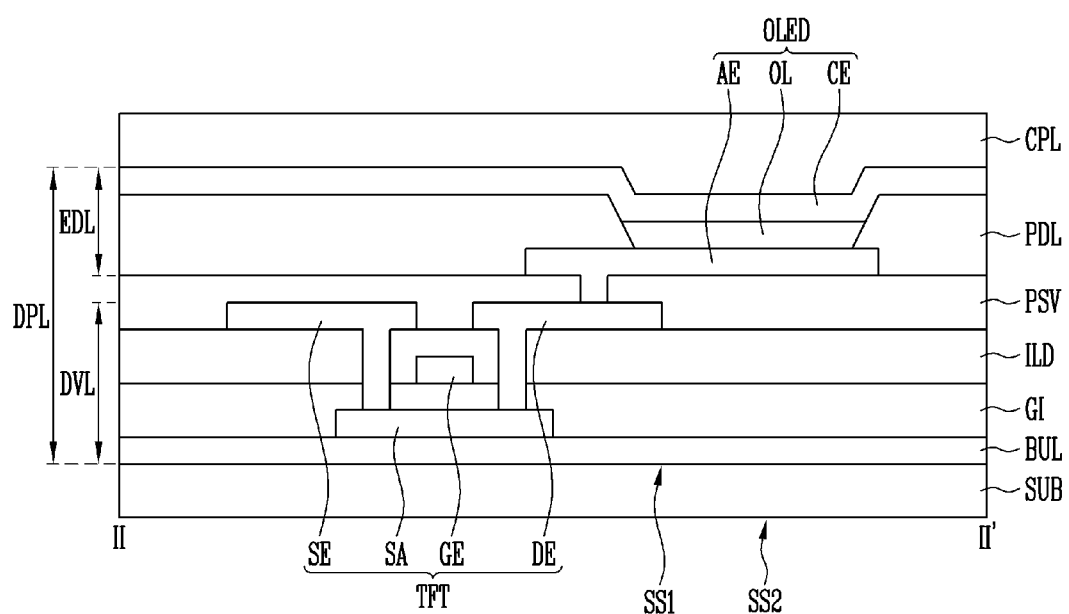
FIG. 4 is a cross-sectional view taken along line II-II' of FIG. 2.
Figure 5:
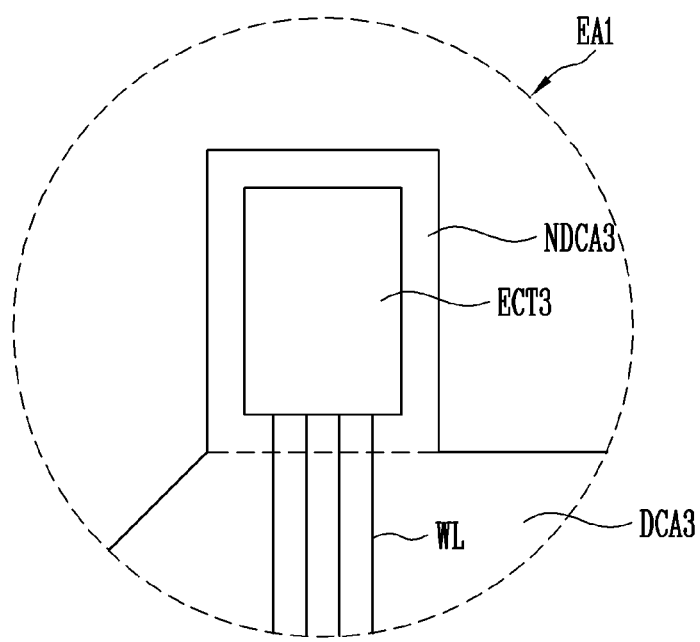
FIG. 5 is an enlarged view of the region EA1 of FIG. 2.
Figure 6:
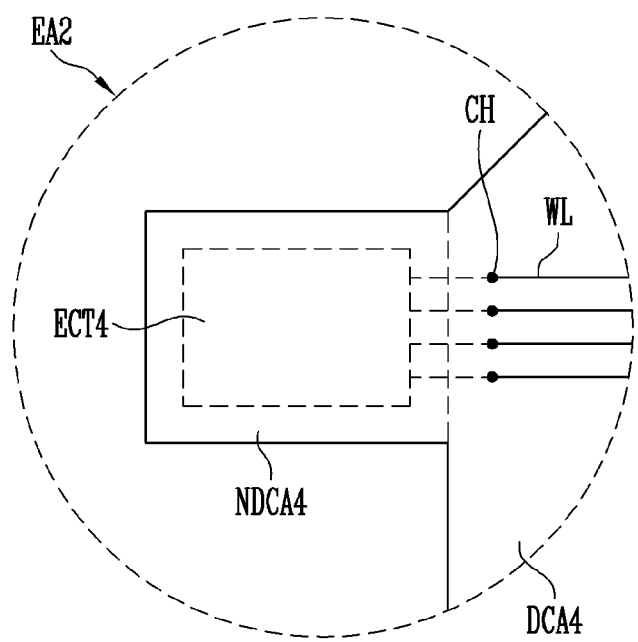
FIG. 6 is an enlarged view of the region EA2 of FIG. 2.
Figure 7:
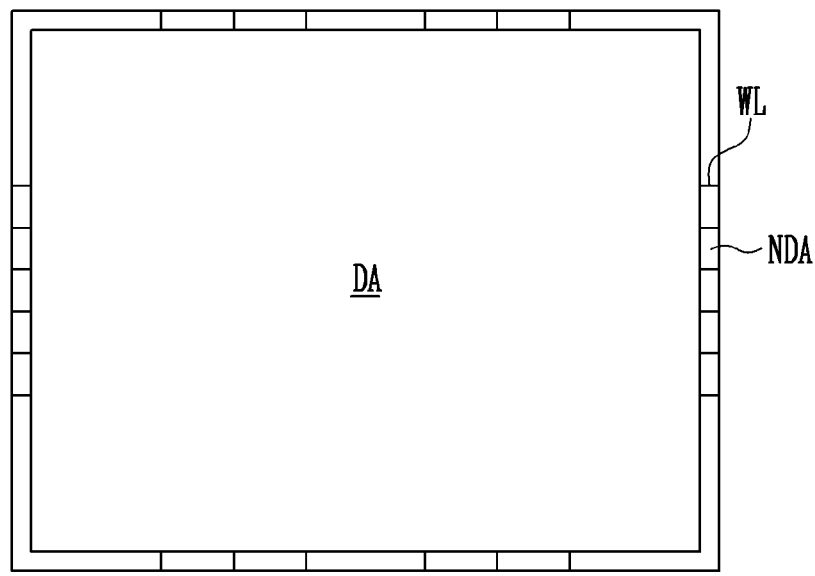
FIG. 7 is a plan view illustrating that a non-display region is bent in the display device of FIG. 2.
Figure 8:
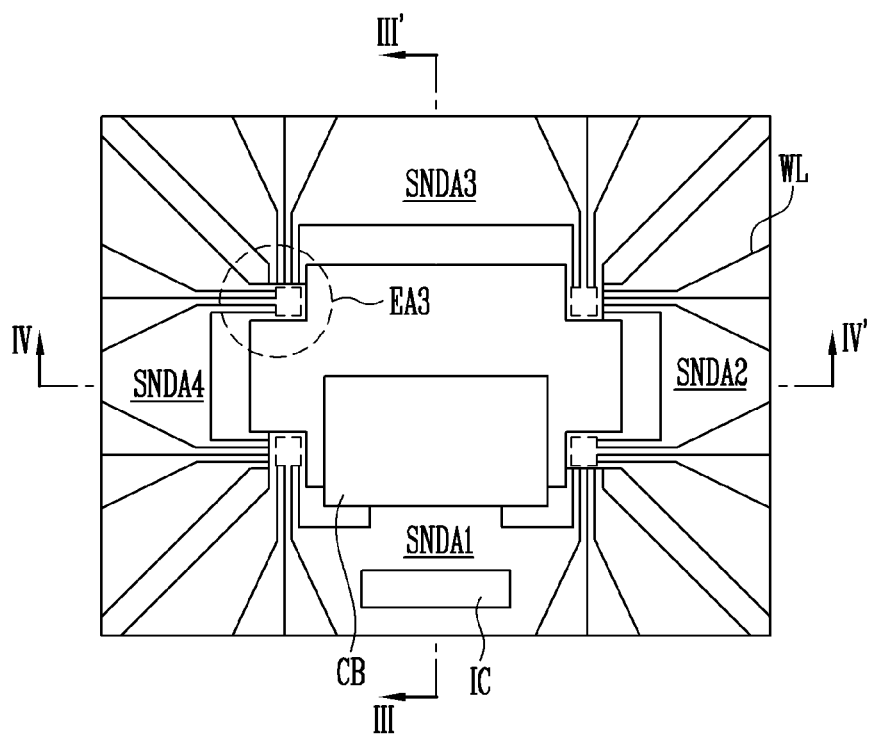
FIG. 8 is a bottom view illustrating that a non-display region is bent in the display device of FIG. 2.
Figure 9:
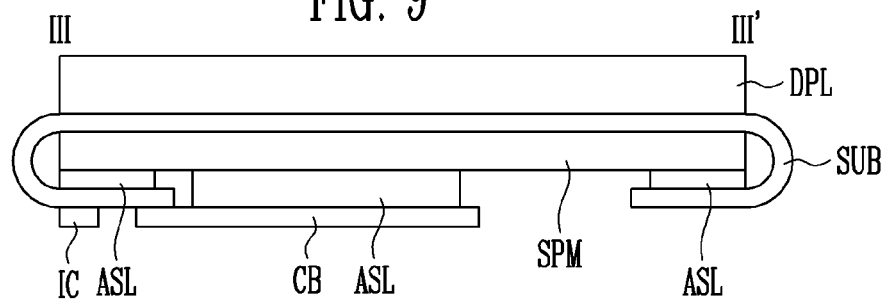
FIG. 9 is a cross-sectional view taken along line of FIG. 8.
Figure 10:
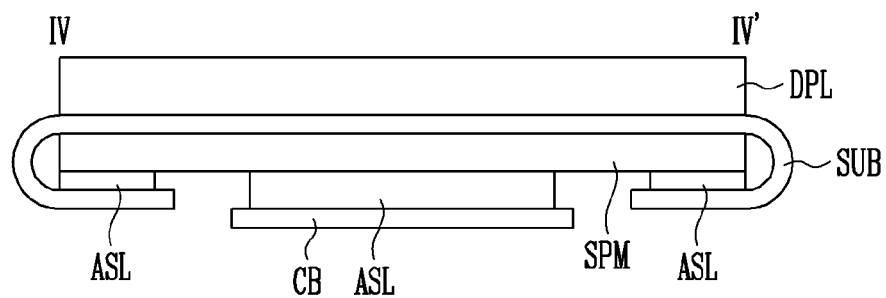
FIG. 10 is a cross-sectional view taken along line IV-IV' of FIG. 8.
Figure 11:
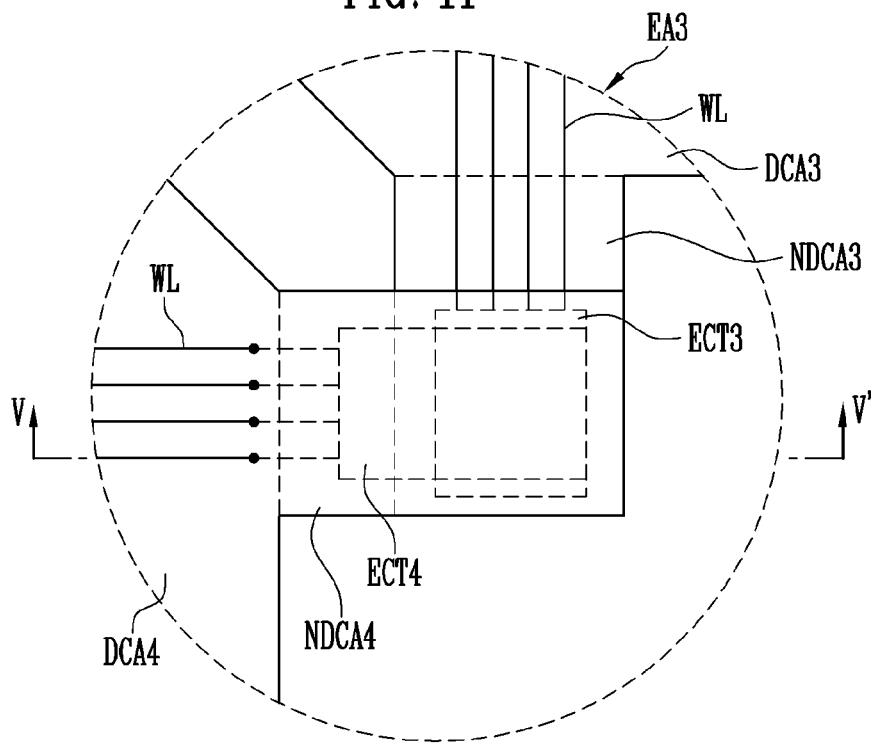
FIG. 11 is an enlarged view of the region EA3 of FIG. 8.
Figure 12:
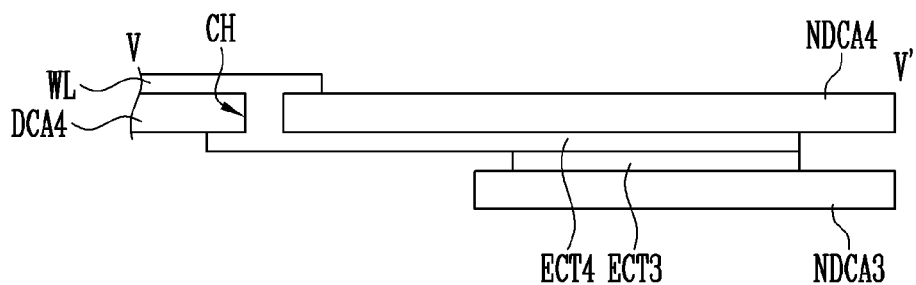
FIG. 12 is a cross-sectional view taken along line V-V' of FIG. 11.

FIG. 2 is a plan view illustrating a display device according to an exemplary embodiment of the invention. FIG. 3 is a cross-sectional view taken along line I-I' of FIG. 2. FIG. 4 is a cross-sectional view taken along line II-II' of FIG. 2. FIG. 5 is an enlarged view of the region EA1 of FIG. 2. FIG. 6 is an enlarged view of the region EA2 of FIG. 2. FIG. 7 is a plan view illustrating that a non-display region is bent in the display device of FIG. 2. FIG. 8 is a bottom view illustrating that a non-display region is bent in the display device of FIG. 2. FIG. 9 is a cross-sectional view taken along line III-III' of FIG. 8. FIG. 10 is a cross-sectional view taken along line IV-IV' of FIG. 8. FIG. 11 is an enlarged view of the region EA3 of FIG. 8. FIG. 12 is a cross-sectional view taken along line V-V' of FIG. 11.

Referring to FIGS. 2 to 12, the display device may include a substrate SUB including a display region DA and a non-display region NDA, a display layer DPL disposed in the display region DA on the substrate SUB, wiring lines WL disposed in the non-display region NDA on the substrate SUB to supply a signal to the display layer DPL, a circuit board CB electrically connected to the wiring lines WL, and a supporting member SPM for supporting the substrate SUB and the circuit board CB when the non-display region NDA is bent.

The substrate SUB includes a transparent insulating material so as to transmit light. The substrate SUB may be a flexible substrate. In an exemplary embodiment, the substrate SUB may be one of a film substrate and a plastic substrate including a high molecular organic material, for example. In an exemplary embodiment, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate, for example. In an exemplary embodiment, the material of which the substrate SUB is disposed may vary and may include fiber reinforced plastic ("FRP"), for example. The substrate SUB has a first surface SS1 and second surface SS2 facing the first surface SS1.

The display region DA may have various shapes. In an exemplary embodiment, the display region DA may be a polygon including straight linear sides, for example. In an exemplary embodiment, the display region DA may be a circle or an ellipse including a curved linear side, for example. In an exemplary embodiment, the display region DA may be a semi-circle or a semi-ellipse including a straight linear side and a curved linear side, for example. According to the exemplary embodiment, it is illustrated that the display region DA is a quadrangle (e.g., rectangular or square) including four straight linear sides.

The non-display region NDA may be adjacent to the display region DA. At least one driving chip IC may be provided in the non-display region NDA. The driving chip IC may be one of the scan driver 110 and the data driver 120 illustrated in FIG. 1.

According to the illustrated exemplary embodiment, the driving chip IC is illustrated as being provided in the non-display region NDA. However, the invention is not limited thereto. In an exemplary embodiment, the driving chip IC may be provided on the circuit board CB, for example.

The non-display region NDA may include a plurality of sub-non-display regions SNDA1, SNDA2, SNDA3, and SNDA4 that respectively extend from the sides of the display region DA. In an exemplary embodiment, since the display region DA is a quadrangle including four sides, the non-display region NDA may include the first sub-non-display region SNDA1, the second sub-non-display region SNDA2, the third sub-non-display region SNDA3, and the fourth sub-non-display region SNDA4 that respectively extend from the four sides of the display region DA, for example. Here, the first sub-non-display region SNDA1 and the third sub-non-display region SNDA3 may face each other and the second sub-non-display region SNDA2 and the fourth sub-non-display region SNDA4 may face each other. When the sub-non-display regions SNDA1, SNDA2, SNDA3, and SNDA4 is bent, the second surface S2 of the sub-non-display regions SNDA1, SNDA2, SNDA3, and SNDA4 may face a surface, that is, a non-emission surface opposite to a surface, on which the display layer DPL is disposed, of the substrate SUB. That is, when the sub-non-display regions SNDA1, SNDA2, SNDA3, and SNDA4 may be bent, the second surface S2 of the sub-non-display regions SNDA1, SNDA2, SNDA3, and SNDA4 may face the second surface S2 of the display region.

When the sub-non-display regions SNDA1, SNDA2, SNDA3, and SNDA4 are bent, a dead space of the display device may be minimized. When the sub-non-display regions SNDA1, SNDA2, SNDA3, and SNDA4 are bent, a part of the non-display region NDA and the display region DA may be exposed to the outside in the display device. Therefore, in the display device, it is possible to prevent the non-display region NDA from being exposed to the outside. In particular, when the sub-non-display regions SNDA1, SNDA2, SNDA3, and SNDA4 are bent, in the display device, only the display region DA may be exposed to the outside. Therefore, a narrow bezel display device or a bezel less display device may be implemented.

Each of the sub-non-display regions SNDA1, SNDA2, SNDA3, and SNDA4 may include each of display connection regions DCA1, DCA2, DCA3, and DCA4 and at least one extension region NDCA1, NDCA2, NDCA3, or NDCA4. In an exemplary embodiment, the first sub-non-display region SNDA1 may include the first display connection region DCA1 and the first extension region NDCA1, for example. The second sub-non-display region SNDA2 may include the second display connection region DCA2 and the second extension region NDCA2. The third sub-non-display region SNDA3 may include the third display connection region DCA3 and the third extension region NDCA3. The fourth sub-non-display region SNDA4 may include the fourth display connection region DCA4 and the fourth extension region NDCA4. The extension regions NDCA1, NDCA2, NDCA3, and NDCA4 may respectively extend from sides of the display connection regions DCA1, DCA2, DCA3, and DCA4.

The display connection regions DCA1, DCA2, DCA3, and DCA4 may be connected to the display region DA. The display connection regions DCA1, DCA2, DCA3, and DCA4 may have various shapes. In an exemplary embodiment, the display connection regions DCA1, DCA2, DCA3, and DCA4 may be polygons including straight linear sides, for example. In an exemplary embodiment, the display connection regions DCA1, DCA2, DCA3, and DCA4 may be semi-circles or semi-ellipses including straight linear sides and curved linear sides. According to the illustrated exemplary embodiment, the display connection regions DCA1, DCA2, DCA3, and DCA4 are quadrangle, in particular, a trapezoid including four straight linear sides. The display connection regions DCA1, DCA2, DCA3 and DCA4 may include two lines parallel to each other and two inclined lines connecting ends of the two lines. Herein, a width of a region close to the display area DA may be larger than a width of a region far from the display area DA in the display connection region DCA1, DCA2, DCA3 and DCA4. The two inclined lines may have inclination angles $\alpha$ and $\beta$ with respect to a side of the display area DA. A sum of inclined angles $\alpha$ and $\beta$ of two inclined lines of the display connection regions may be equal to or less than 90°.

The wiring liens WL may be provided in the display connection regions DCA1, DCA2, DCA3, and DCA4. In an exemplary embodiment, the wiring lines WL may be provided in the display connection regions DCA1, DCA2, DCA3, and DCA4 of all the first sub-non-display region SNDA1, the second sub-non-display region SNDA2, the third sub-non-display region SNDA3, and the fourth sub-non-display region SNDA4, for example. The wiring lines WL may supply power to the pixels. Here, the power may be at least one of the first pixel power ELVDD and the second pixel power ELVSS described in FIG. 1. The wiring lines WL may be provided on the first surface SS1 of the display connection regions DCA1, DCA2, DCA3, and DCA4.

According to the exemplary embodiment, the wiring lines WL are illustrated as supplying power to the pixels. However, the invention is not limited thereto. In an exemplary embodiment, some of the wiring lines WL may supply driving signals to the pixels, for example. Here, the driving signals may be one of the scan signals, the emission control signals, and the data signals.

According to the illustrated exemplary embodiment, the sub-non-display regions SNDA1, SNDA2, SNDA3, and SNDA4 may respectively include two extension regions NDCA1, NDCA2, NDCA3, or NDCA4. The extension regions NDCA1, NDCA2, NDCA3, and NDCA4 may respectively extend from sides of the display connection regions DCA1, DCA2, DCA3, and DCA4. In an exemplary embodiment, the first extension regions NDCA1 may extend from a side that faces a side that contacts the display region DA among the four sides of the first display connection region DCA1, for example. In addition, the first extension regions NDCA1 may be separate from each other. The second extension regions NDCA2 may extend from a side that faces a side that contacts the display region DA among the four sides of the second display connection region DCA2. In addition, the second extension regions NDCA2 may be separate from each other. The third extension regions NDCA3 may extend from a side that faces a side that contacts the display region DA among the four sides of the third display connection region DCA3. In addition, the third extension regions NDCA3 may be separate from each other. The fourth extension regions NDCA4 may extend from a side that faces a side that contacts the display region DA among the four sides of the fourth display connection region DCA4. In addition, the fourth extension regions NDCA4 may be separate from each other.

The extension regions NDCA1, NDCA2, NDCA3, and NDCA4 may have various shapes. In an exemplary embodiment, the extension regions NDCA1, NDCA2, NDCA3, and NDCA4 may be polygons including straight linear sides, for example. In an exemplary embodiment, the extension regions NDCA1, NDCA2, NDCA3, and NDCA4 may be semi-circles or semi-ellipses including straight linear sides and curved linear sides, for example. According to the illustrated exemplary embodiment, the extension regions NDCA1, NDCA2, NDCA3, and NDCA4 are quadrangles each including four straight linear sides.

Connection terminals ECT1, ECT2, ECT3, and ECT4 connected to the wiring lines WL may be respectively provided in the extension regions NDCA1, NDCA2, NDCA3, and NDCA4. In an exemplary embodiment, the first connection terminal ECT1 may be provided to the first extension regions NDCA1, for example. The second connection terminal ECT2 may be provided to the second extension regions NDCA2. The third connection terminal ECT3 may be provided to the third extension regions NDCA3. The fourth connection terminal ECT4 may be provided to the fourth extension regions NDCA4.

The connection terminals ECT1, ECT2, ECT3, and ECT4 provided in the same sub-non-display regions SNDA1, SNDA2, SNDA3, and SNDA4 may be electrically connected to each other. In an exemplary embodiment, the connection terminals ECT1, ECT2, ECT3, and ECT4 provided in the same sub-non-display regions SNDA1, SNDA2, SNDA3, and SNDA4 may be electrically connected through at least one of the wiring lines WL, for example.

One of each of the connection terminals ECT1, ECT2, ECT3, and ECT4 of the extension regions NDCA1, NDCA2, NDCA3, and NDCA4 provided in the same sub-non-display regions SNDA1, SNDA2, SNDA3, and SNDA4 and the other of each of the connection terminals ECT1, ECT2, ECT3, and ECT4 of the extension regions NDCA1, NDCA2, NDCA3, and NDCA4 provided in the same sub-non-display regions SNDA1, SNDA2, SNDA3, and SNDA4 may be provided on a surface, on which the wiring lines WL are provided, between both surfaces of the substrate SUB.

One of each of the connection terminals ECT1, ECT2, ECT3, and ECT4 of the extension regions NDCA1, NDCA2, NDCA3, and NDCA4 provided in the same sub-non-display regions SNDA1, SNDA2, SNDA3, and SNDA4 may be provided on a surface, on which the wiring lines WL are provided, between the both surfaces of the substrate SUB and the other of each of the connection terminals ECT1, ECT2, ECT3, and ECT4 of the extension regions NDCA1, NDCA2, NDCA3, and NDCA4 provided in the same sub-non-display regions SNDA1, SNDA2, SNDA3, and SNDA4 may be provided on a surface opposite to the surface, on which the wiring lines WL are provided, between the both surfaces of the substrate SUB. Here, the connection terminals ECT1, ECT2, ECT3, and ECT4 provided on the surface opposite to the surface, on which the wiring lines WL are provided, may be electrically connected to the wiring lines WL through a contact hole CH that passes through the substrate SUB.

When the sub-non-display regions SNDA1, SNDA2, SNDA3, and SNDA4 are bent, the display connection region DCA1, DCA2, DCA3, and DCA4 of one of the plurality of sub-non-display regions SNDA1, SNDA2, SNDA3, and SNDA4 may not overlap the display connection region DCA1, DCA2, DCA3, and DCA4 of another of the plurality of sub-non-display regions SNDA1, SNDA2, SNDA3, and SNDA4 adjacent to the one of the plurality of sub-non-display regions SNDA1, SNDA2, SNDA3, and SNDA4. In two display connection regions DCA1, DCA2, DCA3, and DCA4 adjacent to each other, a sum of the inclined angles α of one of the two display connection regions DCA1, DCA2, DCA3, and DCA4 and the inclined angles α of another of the two display connection regions DCA1, DCA2, DCA3, and DCA4 may be equal to or less than 90°.

In addition, when the sub-non-display regions SNDA1, SNDA2, SNDA3, and SNDA4 are bent, the extension regions NDCA1, NDCA2, NDCA3, and NDCA4 of the adjacent sub-non-display regions SNDA1, SNDA2, SNDA3, and SNDA4 may overlap. In an exemplary embodiment, when the sub-non-display regions SNDA1, SNDA2, SNDA3, and SNDA4 are bent, one of the first extension regions NDCA1 of the first sub-non-display region SNDA1 and one of the second extension regions NDCA2 of the second sub-non-display region SNDA2 may overlap, for example. The other of the second extension regions NDCA2 of the second sub-non-display region SNDA2 and one of the third extension regions NDCA3 of the third sub-non-display region SNDA3 may overlap with each other. The other of the third extension regions NDCA3 of the third sub-non-display region SNDA3 and one of the fourth extension regions NDCA4 of the fourth sub-non-display region SNDA4 may overlap with each other. The other of the first extension regions NDCA1 of the first sub-non-display region SNDA1 and the other of the fourth extension regions NDCA4 of the fourth sub-non-display region SNDA4 may overlap with each other.

When the extension regions NDCA1, NDCA2, NDCA3, and NDCA4 overlap, one of each of the connection terminals ECT1, ECT2, ECT3, and ECT4 of the extension regions NDCA1, NDCA2, NDCA3, and NDCA4 may overlap the other of each of the connection terminals ECT1, ECT2, ECT3, and ECT4. In addition, one of each of the connection terminals ECT1, ECT2, ECT3, and ECT4 of the overlapping extension regions NDCA1, NDCA2, NDCA3, and NDCA4 may be provided on the surface, on which the wiring lines WL are provided, between the both surfaces of the substrate SUB. In addition, the other of each of the connection terminals ECT1, ECT2, ECT3, and ECT4 of the overlapping extension regions NDCA1, NDCA2, NDCA3, and NDCA4 may be provided on the surface opposite to the surface, on which the wiring lines WL are provided. Therefore, when the sub-non-display regions SNDA1, SNDA2, SNDA3, and SNDA4 are bent, the connection terminals ECT1, ECT2, ECT3, and ECT4 of the overlapping extension regions NDCA1, NDCA2, NDCA3, and NDCA4 face each other and may be electrically connected to each other.

Specifically, when the first extension region NDCA1 of the first sub-non-display region SNDA1 and the second extension region NDCA2 of the second sub-non-display region SNDA2 overlap, at least a part of the first connection terminal ECT1 of the first sub-non-display region SNDA1 may overlap and be electrically connected to at least a part of the second connection terminal ECT2 of the second sub-non-display region SNDA2. When the second extension region NDCA2 of the second sub-non-display region SNDA2 and the third extension region NDCA3 of the third sub-non-display region SNDA3 overlap, at least a part of the second connection terminal ECT2 of the second sub-nondisplay region SNDA2 may overlap and be electrically connected to at least a part of the third connection terminal ECT3 of the third sub-non-display region SNDA3. When the third extension region NDCA3 of the third sub-non-display region SNDA3 and the fourth extension region NDCA4 of the fourth sub-non-display region SNDA4 overlap, at least a part of the third connection terminal ECT3 of the third sub-non-display region SNDA3 may overlap and be electrically connected to at least a part of the fourth connection terminal ECT4 of the fourth sub-non-display region SNDA4. When the fourth extension region NDCA4 of the fourth sub-non-display region SNDA4 and the first extension region NDCA1 of the first sub-non-display region SNDA1 overlap, at least a part of the fourth connection terminal ECT4 of the fourth sub-non-display region SNDA4 may overlap and be electrically connected to at least a part of the first connection terminal ECT1 of the first sub-non-display region SNDA1.

The wiring lines WL of the first sub-non-display region SNDA1 may be electrically connected to the wiring lines WL of the second sub-non-display region SNDA2. The wiring lines WL of the second sub-non-display region SNDA2 may be electrically connected to the wiring lines WL of the third sub-non-display region SNDA3. The wiring lines WL of the third sub-non-display region SNDA3 may be electrically connected to the wiring lines WL of the fourth sub-non-display region SNDA4. The wiring lines WL of the fourth sub-non-display region SNDA4 may be electrically connected to the wiring lines WL of the first sub-non-display region SNDA1. In addition, since the wiring lines WL of the first sub-non-display region SNDA1 are electrically connected to the circuit board CB, all of the wiring lines WL of the sub-non-display regions SNDA1, SNDA2, SNDA3, and SNDA4 may be electrically connected to the circuit board CB that applies at least one of the first pixel power ELVDD and the second pixel power ELVSS.

As described above, the connection terminals ECT1, ECT2, ECT3, and ECT4 provided in the same sub-non-display regions SNDA1, SNDA2, SNDA3, and SNDA4 are electrically connected to each other and the wiring lines WL of the sub-non-display regions SNDA1, SNDA2, SNDA3, and SNDA4 may be electrically connected to the connection terminals ECT1, ECT2, ECT3, and ECT4. In addition, since the pixels receive at least one of the first pixel power ELVDD and the second pixel power ELVSS through the wiring lines WL, the pixels may uniformly receive at least one of the first pixel power ELVDD and the second pixel power ELVSS in all directions of the display region DA. Therefore, the display device may prevent picture quality from deteriorating due to voltage drops of the first pixel power ELVDD and the second pixel power ELVSS.

The display layer DPL may be provided on the first surface SS1. The display layer DPL may include a plurality of pixels. The pixels may be the pixels 140 illustrated in FIG. 1. The pixels 140 may include a driving layer DVL disposed in the display region DA on the substrate SUB and an emission device layer EDL disposed on the driving layer DVL.

The driving layer DVL may include at least one thin film transistor ("TFT").

The TFT may include a semiconductor layer SA, a gate electrode GE insulated from the semiconductor layer SA, and a source electrode SE and a drain electrode DE connected to the semiconductor layer SA.

The semiconductor layer SA may be disposed on the substrate SUB. In an exemplary embodiment, the semiconductor layer SA may include one of amorphous silicon (a-Si), polycrystalline silicon (p-Si), oxide semiconductor, and organic semiconductor, for example. In an exemplary embodiment, the oxide semiconductor may include at least one of zinc (Zn), indium (In), gallium (Ga), tin (Sn), and a combination of Zn, In, Ga, and Sn, for example. In an exemplary embodiment, the oxide semiconductor may include indium-gallium-zinc oxide ("IGZO"), for example.

In the semiconductor layer SA, a source region and a drain region that are doped with impurities or into which impurities are injected may be connected to the source electrode SE and the drain electrode DE, respectively. In addition, a region between the source region and the drain region may be a channel region.

Although not shown, when the semiconductor layer SA includes the oxide semiconductor, light blocking layers for blocking light received to the semiconductor layer SA may be disposed on and under the semiconductor layer SA.

A buffer layer BUL may be disposed between the substrate SUB and the semiconductor layer SA. In an exemplary embodiment, the buffer layer BUL may include at least one of a silicon oxide (SiOx) and a silicon nitride (SiNx). In an exemplary embodiment, the buffer layer BUL may include a first layer including the silicon oxide and a second layer disposed on the first layer and including the silicon nitride, for example. The buffer layer BUL prevents impurities from diffusing and permeating from the substrate SUB into the semiconductor layer SA and may prevent an electrical characteristic of the TFT from deteriorating.

In addition, the buffer layer BUL may prevent moisture and oxygen from permeating from the outside to the OLED. The buffer layer BUL may planarize a surface of the base substrate SUB.

A gate insulating layer GI for covering the semiconductor layer SA may be disposed on the substrate SUB and the semiconductor layer SA. The gate insulating layer GI may insulate the semiconductor layer SA and the gate electrode GE from each other. In an exemplary embodiment, the gate insulating layer GI may include at least one of the silicon oxide and the silicon nitride, for example.

The gate electrode GE may be disposed on the gate insulating layer GI.

An interlayer dielectric layer ILD may be disposed on the gate insulating layer GI and the gate electrode GE. That is, the interlayer dielectric layer ILD may cover the gate electrode GE. In an exemplary embodiment, the interlayer dielectric layer ILD may include at least one of the silicon oxide and the silicon nitride like the gate insulating layer GI, for example. In addition, a part of the interlayer dielectric layer ILD is removed so that the source region and the drain region of the semiconductor layer SA may be exposed.

The source electrode SE and the drain electrode DE may be disposed on the interlayer dielectric layer ILD. The source electrode SE and the drain electrode DE may be insulated from the gate electrode GE by the interlayer dielectric layer ILD. In addition, the source electrode SE and the drain electrode DE may be connected to the source region and the drain region, respectively.

According to the illustrated exemplary embodiment, it is illustrated that the TFT is a top gate TFT. However, the invention is not limited thereto. In an exemplary embodiment, the TFT may be a bottom gate TFT, for example.

A protective layer PSV may be disposed on the driving layer DVL. That is, the protective layer PSV may cover the TFT. In addition, the protective layer PSV may expose a part of the drain electrode DE.

The protective layer PSV may include at least one layer. In an exemplary embodiment, the protective layer PSV may include at least one of an inorganic protective layer and an organic protective layer, for example. In an exemplary embodiment, the protective layer PSV may include the inorganic protective layer that covers the TFT and an organic protective layer disposed on the inorganic protective layer, for example.

In an exemplary embodiment, the inorganic protective layer may include at least one of the silicon oxide and the silicon nitride, for example. In addition, the organic protective layer may include an organic insulating material that may transmit light. In an exemplary embodiment, the organic protective layer may include at least one of polyacrylates resin, epoxy resin, phenolic resin, polyamides resin, polyimides resin, unsaturated polyesters resin, polyphenylene ethers resin, polyphenylene sulfides resin, and benzocyclobutenes resin, for example.

The emission device layer EDL may be disposed on the protective layer PSV. The emission device layer EDL may include the OLED connected to the TFT.

The OLED may include a first electrode AE connected to the drain electrode DE, an organic layer OL disposed on the first electrode AE, and a second electrode CE disposed on the organic layer OL.

One of the first electrode AE and the second electrode CE may be an anode electrode and the other of the first electrode AE and the second electrode CE may be a cathode electrode. In an exemplary embodiment, the first electrode AE may be the anode electrode and the second electrode CE may be the cathode electrode, for example.

In addition, at least one of the first electrode AE and the second electrode CE may be a transmissive electrode. In an exemplary embodiment, when the OLED is a rear surface emission type OLED, the first electrode AE is a transmissive electrode and the second electrode CE may be a reflective electrode, for example. When the OLED is a front surface emission type OLED, the first electrode AE is the reflective electrode and the second electrode CE may be the transmissive electrode, for example. When the OLED is a both side emission type OLED, both the first electrode AE and the second electrode CE may be transmissive electrodes, for example. According to the illustrated exemplary embodiment, it is illustrated that the first electrode AE is the anode electrode and the OLED is the front surface emission type OLED.

The first electrode AE may be disposed on the protective layer PSV. The first electrode AE may include a reflecting layer (not shown) capable of reflecting light and a transparent conductive layer (not shown) disposed on or under the reflecting layer. At least one of the reflecting layer and the transparent conductive layer may be connected to the drain electrode DE.

The reflecting layer may include a material capable of reflecting light. In an exemplary embodiment, the reflecting layer may include at least one of aluminum (Al), silver (Ag), chrome (Cr), molybdenum (Mo), platinum (Pt), nickel (Ni), and an alloy of Al, Ag, Cr, Mo, Pt, and Ni, for example.

The transparent conductive layer may include a transparent conductive oxide. In an exemplary embodiment, the transparent conductive layer may include at least one transparent conductive oxide among indium tin oxide ("ITO"), indium zinc oxide ("IZO"), aluminum zinc oxide ("AZO"), gallium doped zinc oxide ("GZO"), zinc tin oxide ("ZTO"), gallium tin oxide ("GTO"), and fluorine doped tin oxide ("FTO"), for example.

A pixel defining layer PDL may be disposed on the first electrode AE and the protective layer PSV. The pixel defining layer PDL may expose a part of the first electrode AE.

In an exemplary embodiment, the pixel defining layer PDL may cover an edge of the first electrode AE and the protective layer PSV, for example.

The pixel defining layer PDL may include an organic insulating material. In an exemplary embodiment, the pixel defining layer PDL may include at least one of polystyrene, polymethylmethacrylate ("PMMA"), polyacrylonitrile ("PAN"), polyamide ("PA"), polyimide ("PI"), polyarylether ("PAE"), heterocyclic polymer, parylene, epoxy resin, benzocyclobutene ("BCB"), siloxane based resin, and silane based resin, for example.

In an exemplary embodiment, the organic layer OL may have a multilayer thin film structure including at least an emitting layer ("EML"), for example. In an exemplary embodiment, the organic layer OL may include a hole injection layer for injecting holes, a hole transport layer, with high transportability of holes, for preventing electrons that are not combined in the emitting layer from moving and increasing recombination probability of holes and electrons, the emitting layer for emitting light by recombination of the injected electrons and holes, an electron transport layer for smoothly transporting electrons to the emitting layer, and an electron injection layer for injecting electrons, for example. Here, the hole injection layer, the hole transport layer, the electron transport layer, and the electron injection layer may be common layers extending to adjacent pixel regions and shared by the pixel regions. In an exemplary embodiment, a color of light generated by the emitting layer may be one of red, green, blue, and white, for example. However, the invention is not limited thereto. In an exemplary embodiment, a color of light generated by the emitting layer of the organic layer OL may be one of magenta, cyan, and yellow, for example.

The second electrode CE may be disposed on the organic layer OL. The second electrode CE may be a semi-transmissive reflecting layer. In an exemplary embodiment, the second electrode CE may be a thin metal layer having a thickness capable of transmitting light, for example. The second electrode CE transmits a part of the light generated by the organic layer OL and may reflect the remaining light generated by the organic layer OL. The light reflected from the second electrode CE is reflected from the reflecting layer of the first electrode AE and may pass through the second electrode CE due to constructive interference.

The second electrode CE may include a material with a lower work function than the transparent conductive layer of the first electrode AE. In an exemplary embodiment, the second electrode CE may include at least one of Mo, tungsten (W), Ag, magnesium (Mg), Al, Pt, palladium (Pd), gold (Au), Ni, neodymium (Nd), iridium (Ir), Cr, Ca, and an alloy of Mo, W, Ag, Mg, Al, Pt, Pd, Au, Ni, Nd, Ir, Cr, and Ca, for example.

An encapsulation member CPL may be disposed on the second electrode CE. The encapsulation member CPL may isolate the OLED from an external environment. In an exemplary embodiment, the encapsulation member CPL may prevent external moisture and oxygen from permeating into the OLED, for example.

The encapsulation member CPL may be a thin film encapsulation layer including a plurality of inorganic layers (not shown) and a plurality of organic layers (not shown) disposed on the second electrode CE. In an exemplary embodiment, the encapsulation member CPL may have a structure in which the inorganic layer and the organic layer are alternately laminated, for example.

As occasion demands, the encapsulation member CPL may be an encapsulation substrate bonded to the substrate SUB and sealing up an internal space. The encapsulation substrate may be bonded to the substrate SUB through a sealant.

The circuit board CB may be provided on the non-emission surface of the substrate SUB. In an exemplary embodiment, the circuit board CB may be implemented by a printed circuit board ("PCB") or a flexible PCB ("FPCB"), for example. The circuit board CB may be connected to at least one of the sub-non-display regions SNDA1, SNDA2, SNDA3, and SNDA4. In an exemplary embodiment, the circuit board CB is connected to the first sub-non-display region SNDA1 and may be electrically connected to the wiring lines WL of the first sub-non-display region SNDA1, for example.

The circuit board CB may have the first pixel power ELVDD and the second pixel power ELVSS applied to the pixels 140 through the wiring lines WL. In an exemplary embodiment, the circuit board CB electrically connects an external power supply device (not shown) and the wiring lines WL so that the first pixel power ELVDD and the second pixel power ELVSS may be applied to the pixels 140 or the circuit board CB includes a power supply unit (not shown) and electrically connects the external power supply unit and the wiring lines WL so that the first pixel power ELVDD and the second pixel power ELVSS may be applied to the pixels 140, for example.

The supporting member SPM may be provided between the substrate SUB and the circuit board CB. When the sub-non-display regions SNDA1, SNDA2, SNDA3, and SNDA4 are bent and are disposed on the non-emission surface of the substrate SUB, the supporting member SPM may support the sub-non-display regions SNDA1, SNDA2, SNDA3, and SNDA4. Therefore, the supporting member SPM may prevent the sub-non-display regions SNDA1, SNDA2, SNDA3, and SNDA4 from recovering previous states.

In addition, an adhesive layer ASL may be provided between the supporting member SPM and the sub-non-display regions SNDA1, SNDA2, SNDA3, and SNDA4 and between the supporting member SPM and the circuit board CB. The adhesive layer ASL may fix the sub-non-display regions SNDA1, SNDA2, SNDA3, and SNDA4 and the circuit board CB to the supporting member SPM.

Figure 13:
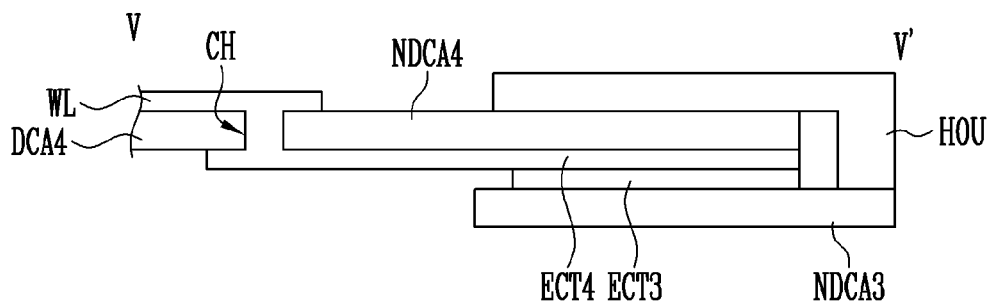
FIG. 13 is a cross-sectional view illustrating another example of a connection relationship between extension regions of adjacent sub-non-display regions.

FIG. 13 is a cross-sectional view illustrating another example of a connection relationship between extension regions of adjacent sub-non-display regions.

Referring to FIGS. 2 to 11 and 13, when the sub-non-display regions SNDA1, SNDA2, SNDA3, and SNDA4 are bent, the sub-non-display regions SNDA1, SNDA2, SNDA3, and SNDA4 are bent and may be disposed on a surface, that is, the non-emission surface, opposite to a surface on which the display layer DPL of the substrate SUB is disposed.

When the sub-non-display regions SNDA1, SNDA2, SNDA3, and SNDA4 are bent, the extension regions NDCA1, NDCA2, NDCA3, and NDCA4 of the sub-non-display regions SNDA1, SNDA2, SNDA3, and SNDA4 adjacent to each other may overlap.

When the extension regions NDCA1, NDCA2, NDCA3, and NDCA4 overlap, one of each of the connection terminals ECT1, ECT2, ECT3, and ECT4 of the overlapping extension regions NDCA1, NDCA2, NDCA3, and NDCA4 may be electrically connected to the other of each of the connection terminals ECT1, ECT2, ECT3, and ECT4 of the extension regions NDCA1, NDCA2, NDCA3, and NDCA4.

One of each of the extension regions NDCA1, NDCA2, NDCA3, and NDCA4 of the sub-non-display regions SNDA1, SNDA2, SNDA3, and SNDA4 adjacent to each other may include a housing HOU that covers each of the connection terminals ECT1, ECT2, ECT3, and ECT4 and provides an internal space. The other of each of the extension regions NDCA1, NDCA2, NDCA3, and NDCA4 of the sub-non-display regions SNDA1, SNDA2, SNDA3, and SNDA4 adjacent to each other may be inserted into the internal space provided by the housing HOU. That is, the extension regions NDCA1, NDCA2, NDCA3, and NDCA4 of the sub-non-display regions SNDA1, SNDA2, SNDA3, and SNDA4 adjacent to each other may be connected by a method similar to a connector.

Figure 14:
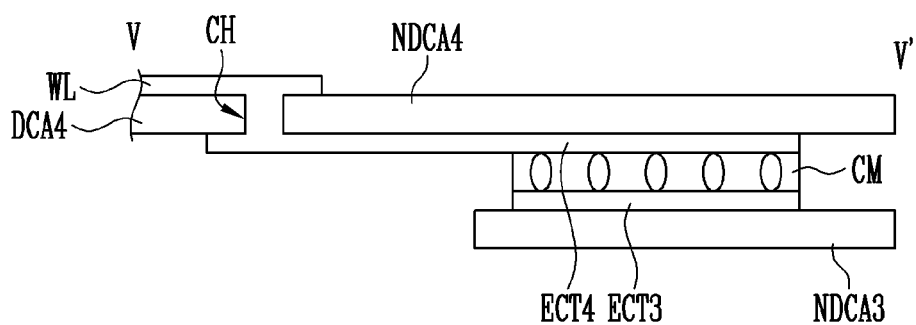
FIG. 14 is a cross-sectional view illustrating another example of a connection relationship between extension regions of adjacent sub-non-display regions.

FIG. 14 is a cross-sectional view illustrating another example of a connection relationship between extension regions of adjacent sub-non-display regions.

Referring to FIGS. 2 to 11 and 14, when the sub-non-display regions SNDA1, SNDA2, SNDA3, and SNDA4 are bent, the sub-non-display regions SNDA1, SNDA2, SNDA3, and SNDA4 are bent and may be disposed on a surface, that is, the non-emission surface, opposite to a surface on which the display layer DPL of the substrate SUB is disposed When the sub-non-display regions SNDA1, SNDA2, SNDA3, and SNDA4 are bent, the extension regions NDCA1, NDCA2, NDCA3, and NDCA4 of the sub-non-display regions SNDA1, SNDA2, SNDA3, and SNDA4 adjacent to each other may overlap.

When the extension regions NDCA1, NDCA2, NDCA3, and NDCA4 overlap, one of each of the connection terminals ECT1, ECT2, ECT3, and ECT4 of the overlapping extension regions NDCA1, NDCA2, NDCA3, and NDCA4 may be electrically connected to the other of each of the connection terminals ECT1, ECT2, ECT3, and ECT4 through a conductive member CM. In an exemplary embodiment, the conductive member CM may be an anisotropic conductive film ("ACF") or an anisotropic conductive adhesive ("ACA"), for example. In an exemplary embodiment, the conductive member CM is disposed among the overlapping terminals ECT1, ECT2, ECT3, and ECT4 and may electrically connect the terminals ECT1, ECT2, ECT3, and ECT4, for example.

Figure 15:
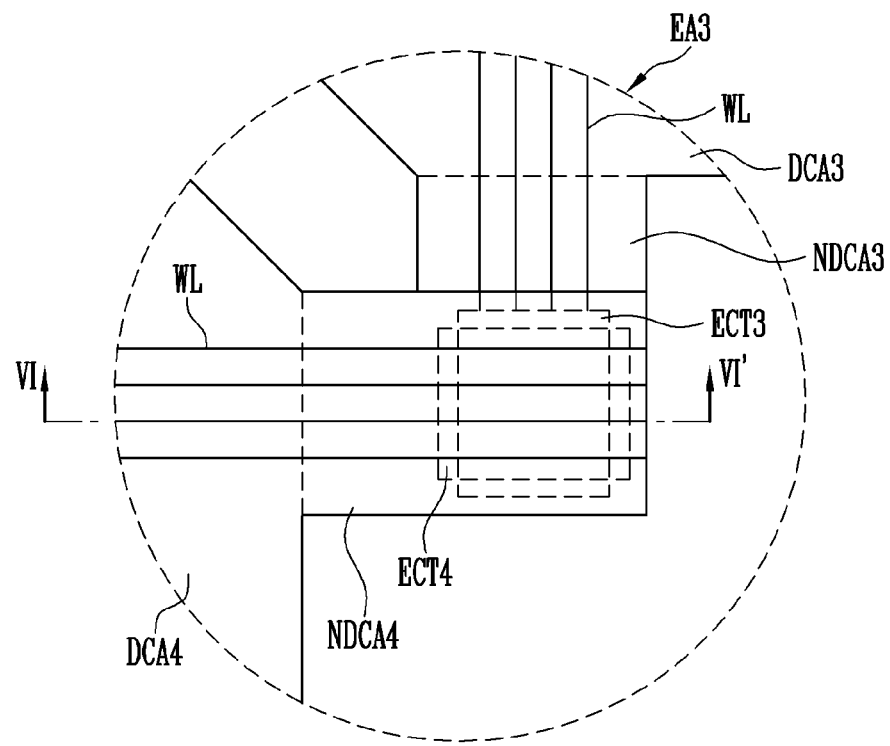
FIG. 15 is an enlarged view of the region EA3 of FIG. 8.
Figure 16:
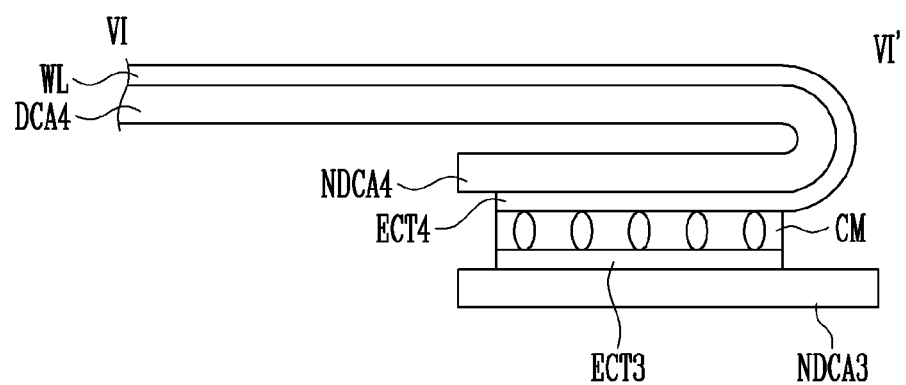
FIG. 16 is a cross-sectional view taken along line VI-VI' of FIG. 15.

FIGS. 15 and 16 are a partial plan view and a cross-sectional view illustrating another example of a connection relationship of extension regions of sub-non-display regions adjacent to each other. FIG. 15 is an enlarged view of the region EA3 of FIG. 8. FIG. 16 is a cross-sectional view taken along line VI-VI' of FIG. 15.

Referring to FIGS. 2 to 10, 15, and 16, when the sub-non-display regions SNDA1, SNDA2, SNDA3, and SNDA4 are bent, the sub-non-display regions SNDA1, SNDA2, SNDA3, and SNDA4 are bent and may be disposed on a surface, that is, the non-emission surface, opposite to a surface on which the display layer DPL of the substrate SUB is disposed.

When the sub-non-display regions SNDA1, SNDA2, SNDA3, and SNDA4 are bent, the extension regions NDCA1, NDCA2, NDCA3, and NDCA4 of the sub-non-display regions SNDA1, SNDA2, SNDA3, and SNDA4 adjacent to each other may overlap.

The connection terminals ECT1, ECT2, ECT3, and ECT4 provided in the overlapping extension regions NDCA1, NDCA2, NDCA3, and NDCA4 may be provided on the same plane of the substrate SUB. In an exemplary embodiment, the connection terminals ECT1, ECT2, ECT3, and ECT4 provided in the overlapping extension regions NDCA1, NDCA2, NDCA3, and NDCA4 may be provided on a surface, on which the wiring lines WL are provided, between both surfaces of the substrate SUB, for example.

Here, one of the overlapping extension regions NDCA1, NDCA2, NDCA3, and NDCA4 may be bent. Therefore, the connection terminals ECT1, ECT2, ECT3, and ECT4 of the overlapping extension regions NDCA1, NDCA2, NDCA3, and NDCA4 may face each other.

The connection terminals ECT1, ECT2, ECT3, and ECT4 that face each other may be electrically connected through the conductive member CM. In an exemplary embodiment, the conductive member CM may be the ACF or the ACA, for example. In an exemplary embodiment, the conductive member CM is disposed among the facing terminals ECT1, ECT2, ECT3, and ECT4 and may electrically connect the terminals ECT1, ECT2, ECT3, and ECT4, for example.

Hereinafter, display devices according to other exemplary embodiments of the invention will be described with reference to FIGS. 17 to 30. In FIGS. 17 to 30, the same elements as the elements illustrated in FIGS. 1 to 16 are denoted by the same reference numerals and brief description thereof will be given. In addition, in FIGS. 17 to 30, in order to avoid giving repeated description, different points from FIGS. 1 to 16 will be mainly described.

Figure 17:
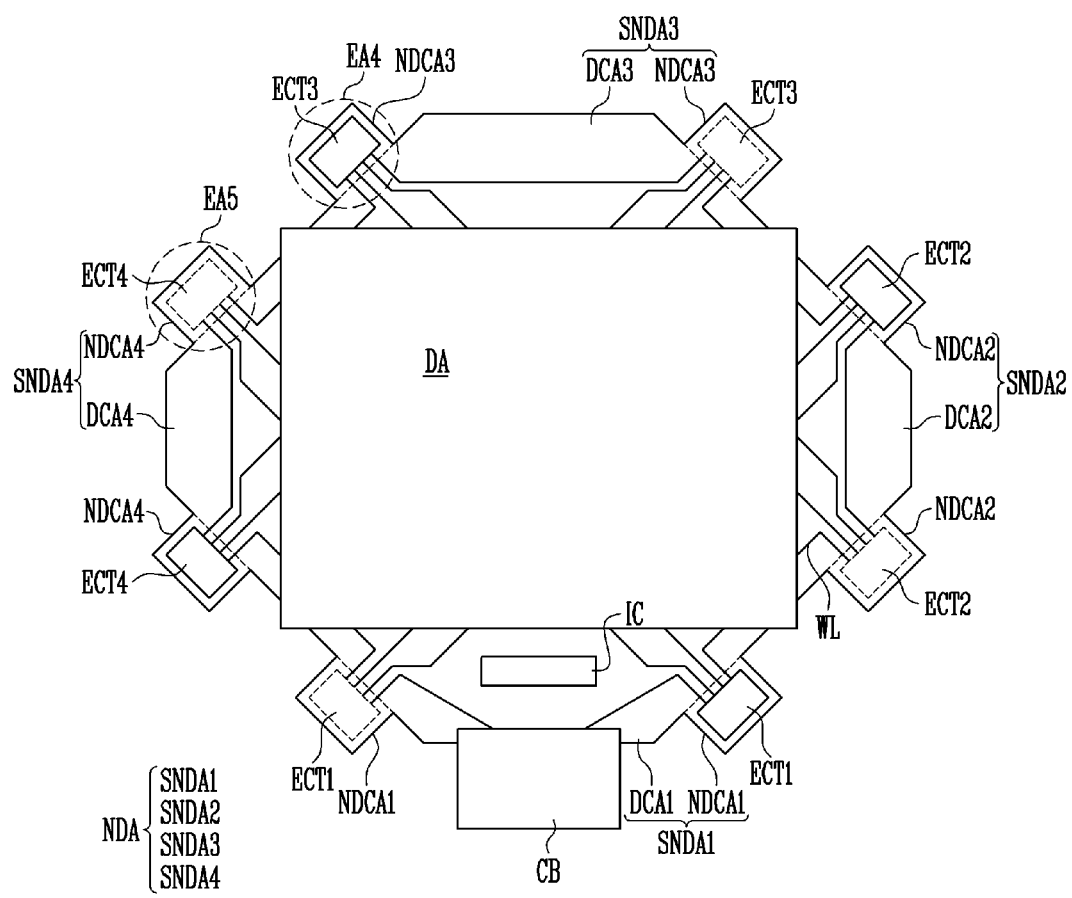
FIG. 17 is a plan view illustrating another exemplary embodiment of a display device according to the invention.
Figure 18:
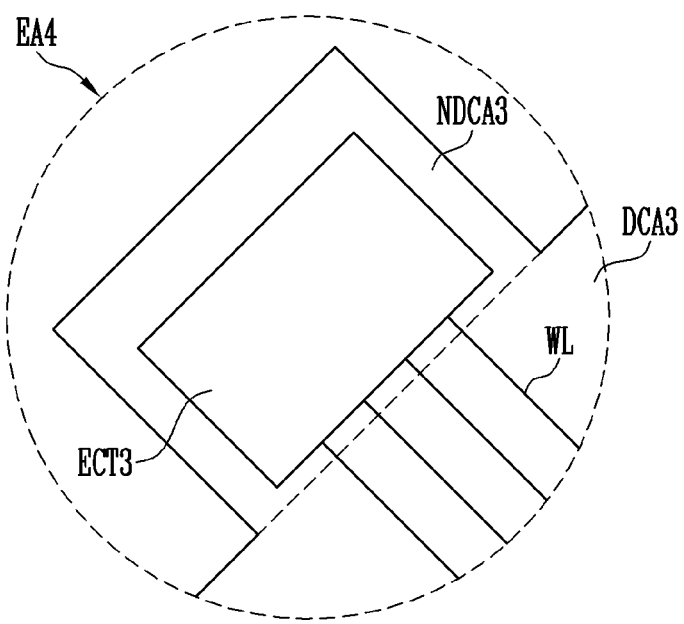
FIG. 18 is an enlarged view of the region EA4 of FIG. 17.
Figure 19:
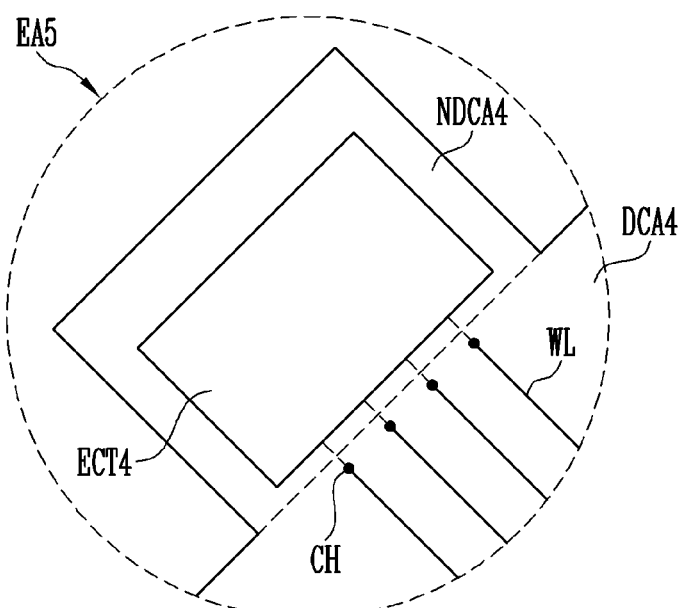
FIG. 19 is an enlarged view of the region EA5 of FIG. 17.
Figure 20:
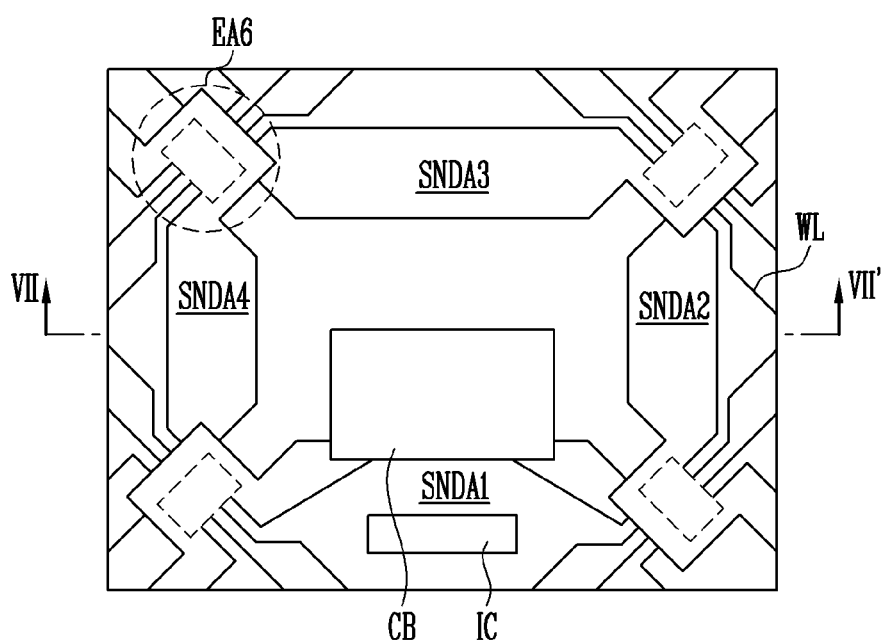
FIG. 20 is a bottom view illustrating a display device in which a non-display region is bent.
Figure 21:
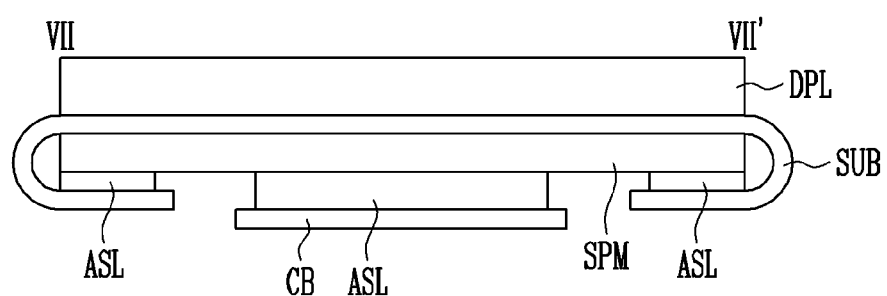
FIG. 21 is a cross-sectional view taken along line VII-VII' of FIG. 20.
Figure 22:
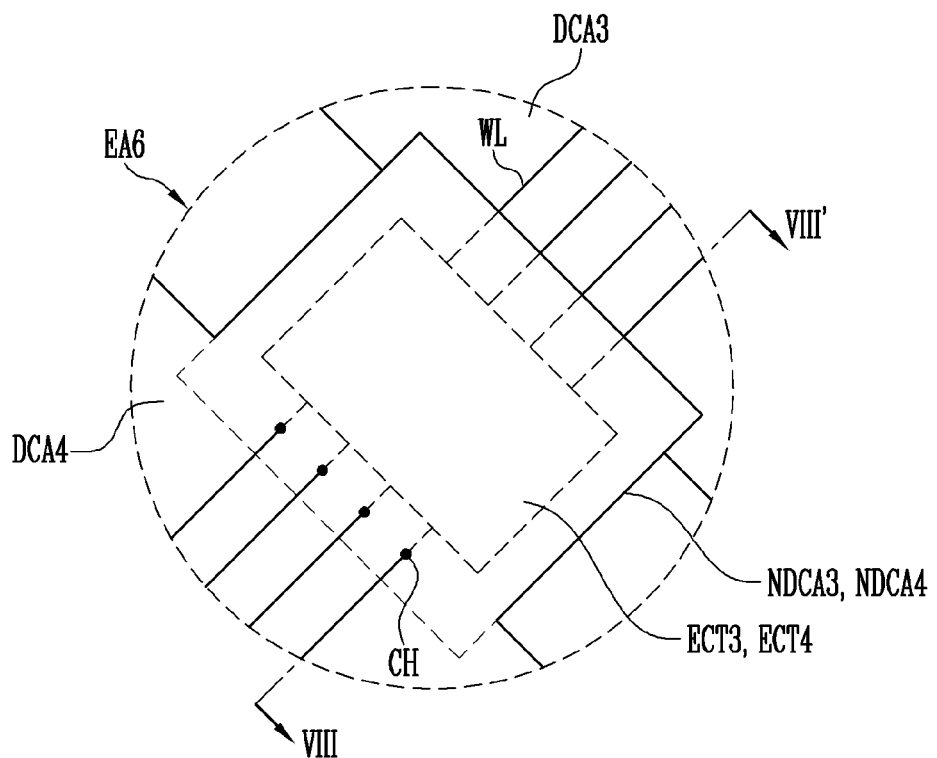
FIG. 22 is an enlarged view of the region EA6 of FIG. 20.
Figure 23:
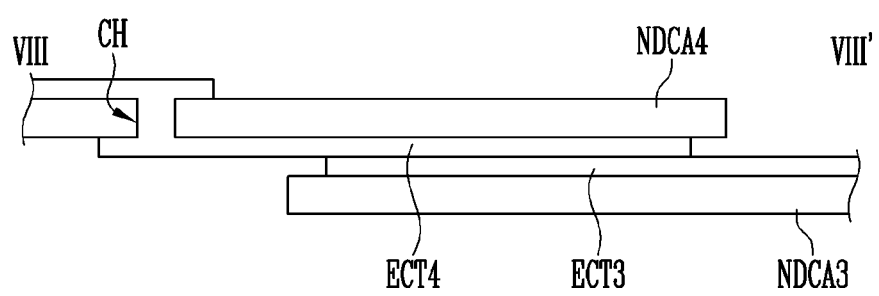
FIG. 23 is a cross-sectional view taken along line VIII-VIII' of FIG. 22.

FIG. 17 is a plan view illustrating a display device according to another exemplary embodiment of the invention. FIG. 18 is an enlarged view of the region EA4 of FIG. 17. FIG. 19 is an enlarged view of the region EA5 of FIG. 17. FIG. 20 is a bottom view illustrating a display device in which a non-display region is bent. FIG. 21 is a cross-sectional view taken along line VII-VII' of FIG. 20. FIG. 22 is an enlarged view of the region EA6 of FIG. 20. FIG. 23 is a cross-sectional view taken along line VIII-VIII' of FIG. 22.

Referring to FIGS. 17 to 23, the display device may include a substrate including a display region DA and a non-display region NDA, a display layer DPL disposed in the display region DA on the substrate SUB, wiring lines WL disposed in the non-display region NDA on the substrate SUB to supply a signal to the display layer DPL, a circuit board CB electrically connected to the wiring lines WL, and a supporting member SPM for supporting the substrate SUB and the circuit board CB when the non-display region NDA is bent.

In an exemplary embodiment, the display region DA may be a quadrangle including four straight linear sides, for example.

The non-display region NDA may be adjacent to the display region DA. The non-display region NDA may include a plurality of sub-non-display regions SNDA1, SNDA2, SNDA3, and SNDA4 that respectively contact the sides of the display region DA. The sub-non-display regions SNDA1, SNDA2, SNDA3, and SNDA4 are bent and may be disposed on a surface, that is, a non-emission surface, opposite to a surface on which the display layer DPL of the substrate SUB is disposed.

In addition, at least one of the sub-non-display regions SNDA1, SNDA2, SNDA3, and SNDA4, for example, the first sub-non-display region SNDA1 is connected to the circuit board CB and the wiring lines WL of the first sub-non-display region SNDA1 may receive a signal through the circuit board CB.

Each of the sub-non-display regions SNDA1, SNDA2, SNDA3, and SNDA4 may include each of display connection regions DCA1, DCA2, DCA3, and DCA4 that contact the display region DA and at least one extension region NDCA1, NDCA2, NDCA3, or NDCA4 extending from a part of each of the display connection regions DCA1, DCA2, DCA3, and DCA4.

The display connection regions DCA1, DCA2, DCA3, and DCA4 may have various shapes. According to the illustrated exemplary embodiment, the display connection regions DCA1, DCA2, DCA3, and DCA4 are quadrangles each including four straight linear sides, for example.

The wiring liens WL may be provided in the display connection regions DCA1, DCA2, DCA3, and DCA4. Parts of the wiring lines WL may supply power to the pixels 140 (refer to FIG. 1). Here, the power may be one of the first pixel power ELVDD and the second pixel power ELVSS (refer to FIG. 1). The remaining wiring lines WL may transmit the pixel power to the other sub-non-display regions SNDA1, SNDA2, SNDA3, and SNDA4.

Each of the sub-non-display regions SNDA1, SNDA2, SNDA3, and SNDA4 may include two extension regions NDCA1, NDCA2, NDCA3, or NDCA4. Each of the extension regions NDCA1, NDCA2, NDCA3, and NDCA4 may extend from one side of each of the display connection regions DCA1, DCA2, DCA3, and DCA4. In an exemplary embodiment, each of the extension regions NDCA1, NDCA2, NDCA3, and NDCA4 may extend from a side that contacts the display region DA among the four sides of each of the display connection regions DCA1, DCA2, DCA3, and DCA4, for example.

Connection terminals ECT1, ECT2, ECT3, and ECT4 connected to the wiring lines WL may be respectively provided in the extension regions NDCA1, NDCA2, NDCA3, and NDCA4.

When the sub-non-display regions SNDA1, SNDA2, SNDA3, and SNDA4 are bent, the extension regions NDCA1, NDCA2, NDCA3, and NDCA4 of the sub-non-display regions SNDA1, SNDA2, SNDA3, and SNDA4 adjacent to each other may overlap.

When the extension regions NDCA1, NDCA2, NDCA3, and NDCA4 overlap, one of each of the connection terminals ECT1, ECT2, ECT3, and ECT4 of the overlapping extension regions NDCA1, NDCA2, NDCA3, and NDCA4 may overlap and be electrically connected to the other of each of the connection terminals ECT1, ECT2, ECT3, and ECT4. Therefore, all the wiring lines WL of the sub-non-display regions SNDA1, SNDA2, SNDA3, and SNDA4 may be electrically connected to the circuit board CB that applies at least one of the first pixel power ELVDD and the second pixel power ELVSS.

Since the pixels 140 receive at least one of the first pixel power ELVDD and the second pixel power ELVSS through the wiring lines, the pixels 140 may uniformly receive at least one of the first pixel power ELVDD and the second pixel power ELVSS in all directions of the display region DA. Therefore, the display device may prevent picture quality from deteriorating due to voltage drops of the first pixel power ELVDD and the second pixel power ELVSS.

Figure 24:
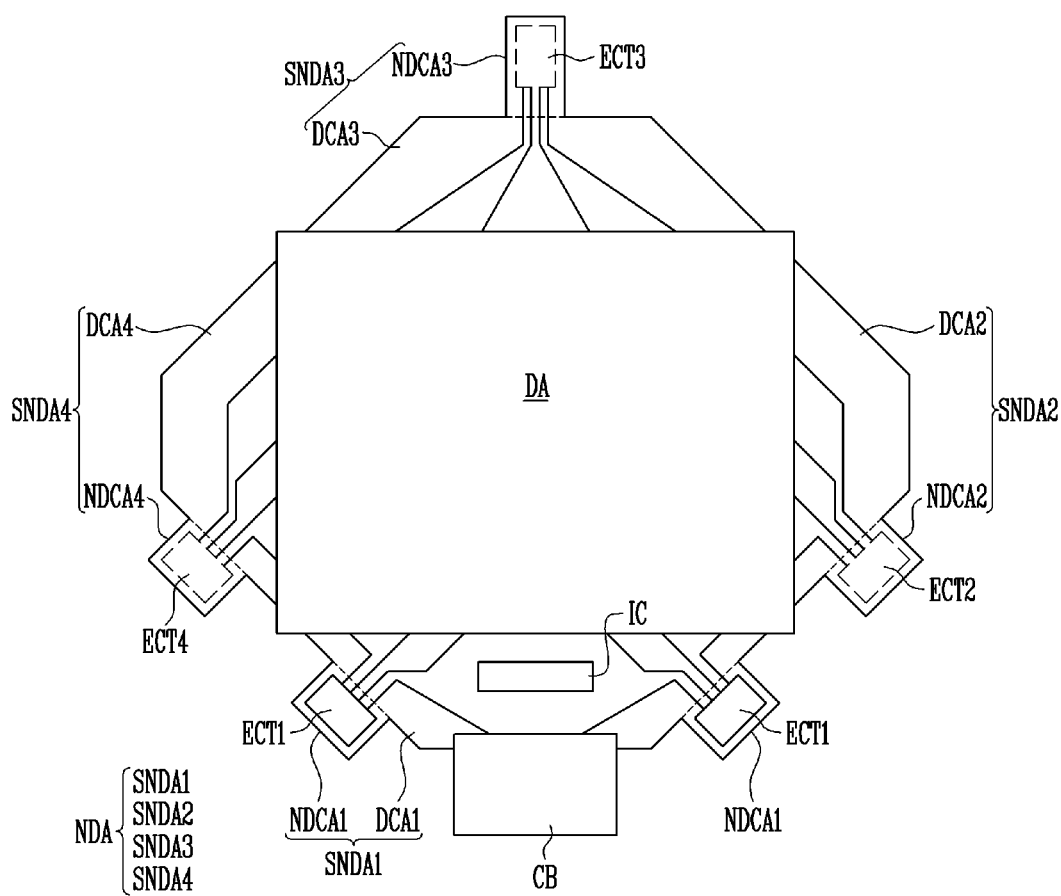
FIG. 24 is a plan view illustrating another exemplary embodiment of a display device according to the invention.
Figure 25:
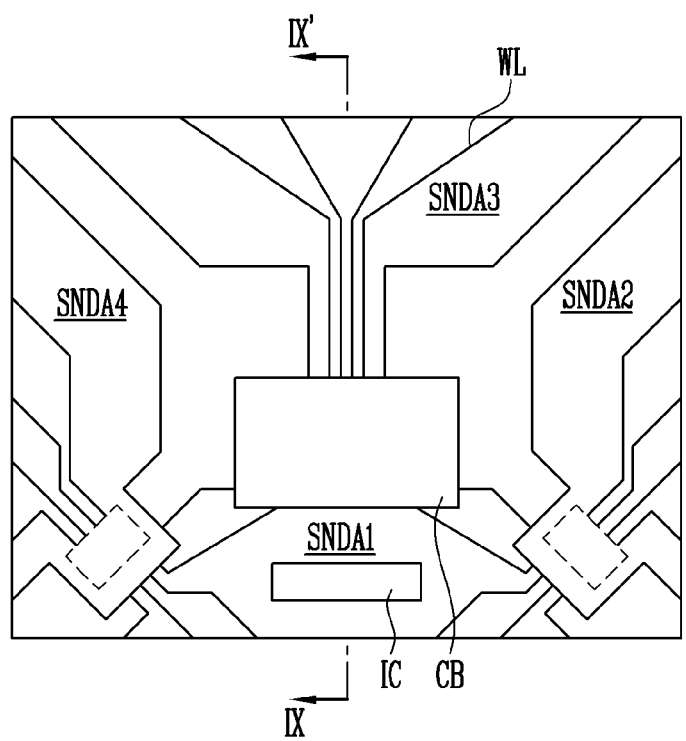
FIG. 25 is a bottom view illustrating that a non-display region is bent in the display device of FIG. 24.
Figure 26:
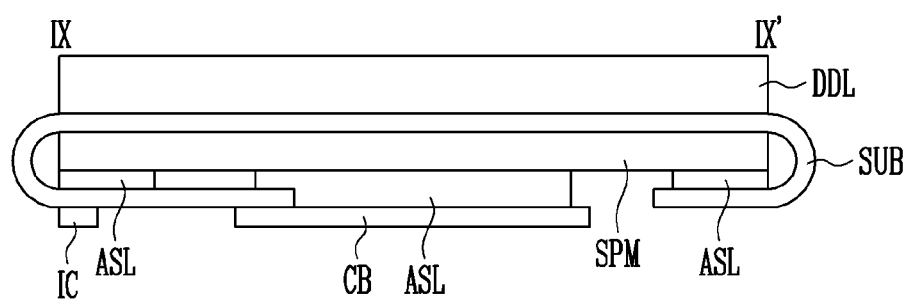
FIG. 26 is a cross-sectional view taken along line IX-IX' of FIG. 25.

FIG. 24 is a plan view illustrating a display device according to another exemplary embodiment of the invention. FIG. 25 is a bottom view illustrating that a non-display region is bent in the display device of FIG. 24. FIG. 26 is a cross-sectional view taken along line IX-IX' of FIG. 25.

Referring to FIGS. 24 to 26, the display device may include a substrate including a display region DA and a non-display region NDA, a display layer DPL disposed in the display region DA on the substrate SUB, wiring lines WL disposed in the non-display region NDA on the substrate SUB to supply a signal to the display layer DPL, a circuit board CB electrically connected to the wiring lines WL, and a supporting member SPM for supporting the substrate SUB and the circuit board CB when the non-display region NDA is bent.

In an exemplary embodiment, the display region DA may be a quadrangle including four straight linear sides, for example.

The non-display region NDA may be adjacent to the display region DA. The non-display region NDA may include a plurality of sub-non-display regions SNDA1, SNDA2, SNDA3, and SNDA4 that respectively contact the sides of the display region DA. The sub-non-display regions SNDA1, SNDA2, SNDA3, and SNDA4 are bent and may be disposed on a surface, that is, a non-emission surface opposite to a surface on which the display layer DPL of the substrate SUB is disposed. In addition, at least one of the sub-non-display regions SNDA1, SNDA2, SNDA3, and SNDA4, for example, the first sub-non-display region SNDA1 is connected to the circuit board CB and the wiring lines WL of the first sub-non-display region SNDA1 may receive a signal through the circuit board CB.

Each of the sub-non-display regions SNDA1, SNDA2, SNDA3, and SNDA4 may include each of display connection regions DCA1, DCA2, DCA3, and DCA4 that contact the display region DA and at least one extension region NDCA1, NDCA2, NDCA3, or NDCA4 extending from a part of each of the display connection regions DCA1, DCA2, DCA3, and DCA4.

The display connection regions DCA1, DCA2, DCA3, and DCA4 may have various shapes. According to the exemplary embodiment, the display connection regions DCA1, DCA2, DCA3, and DCA4 are quadrangles each including four straight linear sides.

The wiring liens WL may be provided in the display connection regions DCA1, DCA2, DCA3, and DCA4. Parts of the wiring lines WL may supply power to the pixels 140 (refer to FIG. 1). Here, the power may be one of the first pixel power ELVDD and the second pixel power ELVSS (refer to FIG. 1). The remaining wiring lines WL may transmit the pixel power to the other sub-non-display regions SNDA1, SNDA2, SNDA3, and SNDA4.

The first sub-non-display region SNDA1, to which the circuit board CB is connected, among the sub-non-display regions SNDA1, SNDA2, SNDA3, and SNDA4 includes two extension regions NDCA1. Each of the second sub-non-display region SNDA2, the third sub-non-display region SNDA3, and the fourth sub-non-display region SNDA4 may include one extension region NDCA2, NDCA3, of NDCA4.

Connection terminals ECT1, ECT2, ECT3, and ECT4 connected to the wiring lines WL may be respectively provided in the extension regions NDCA1, NDCA2, NDCA3, and NDCA4.

When the sub-non-display regions SNDA1, SNDA2, SNDA3, and SNDA4 are bent, the first extension regions NDCA1 of the first sub-non-display region SNDA1 may overlap the extension regions NDCA2 and NDCA4 of the second sub-non-display region SNDA2 and the fourth sub-non-display region SNDA4. Therefore, the wiring lines WL of the first sub-non-display region SNDA1 may be electrically connected to the wiring lines WL of the second sub-non-display region SNDA2 and the fourth sub-non-display region SNDA4.

In addition, when the sub-non-display regions SNDA1, SNDA2, SNDA3, and SNDA4 are bent, the third sub-non-display region SNDA3 may overlap a part of the circuit board CB. Here, the connection terminal ECT3 of the third sub-non-display region SNDA3 may be electrically connected to the circuit board CB. Therefore, all the wiring lines WL of the sub-non-display regions SNDA1, SNDA2, SNDA3, and SNDA4 may be electrically connected to the circuit board CB that applies at least one of the first pixel power ELVDD and the second pixel power ELVSS.

Since the pixels 140 receive at least one of the first pixel power ELVDD and the second pixel power ELVSS through the wiring lines, the pixels 140 may uniformly receive at least one of the first pixel power ELVDD and the second pixel power ELVSS in all directions of the display region DA. Therefore, the display device may prevent picture quality from deteriorating due to voltage drops of the first pixel power ELVDD and the second pixel power ELVSS.

Figure 27:
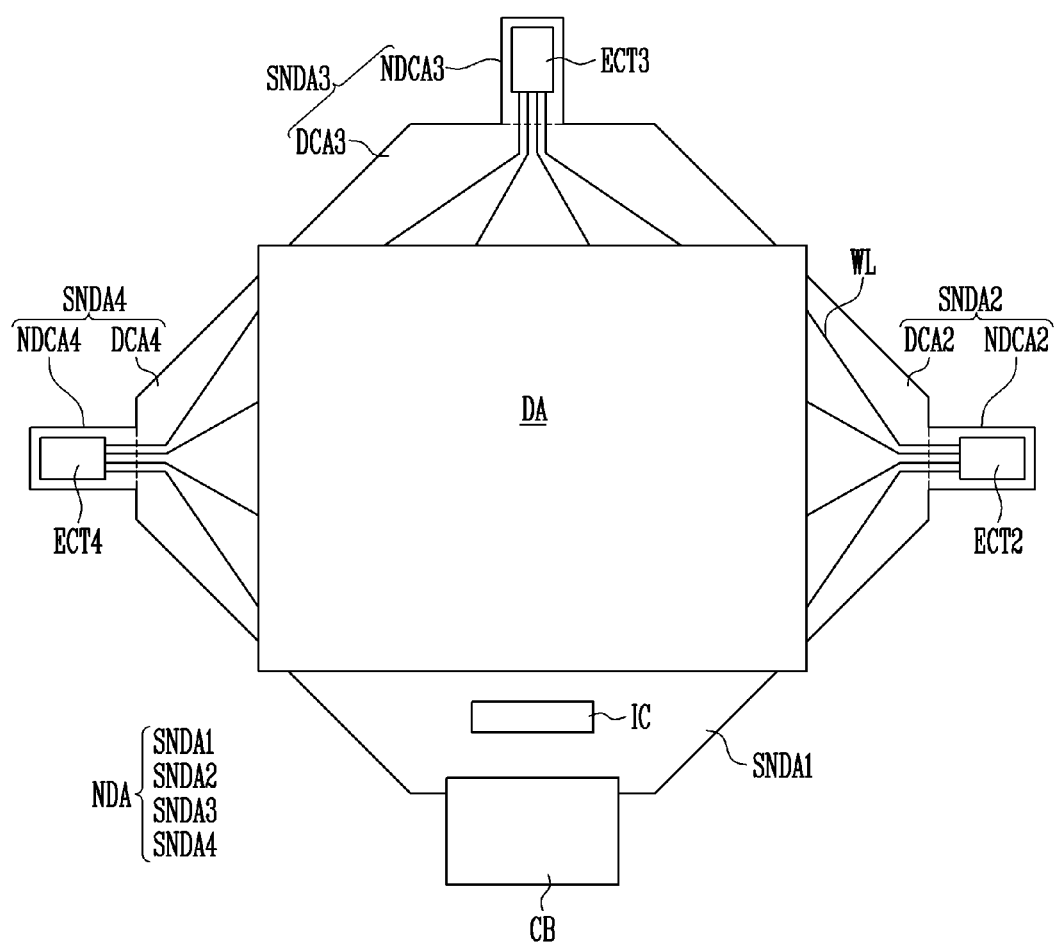
FIG. 27 is a plan view illustrating another exemplary embodiment of a display device according to the invention.
Figure 28:
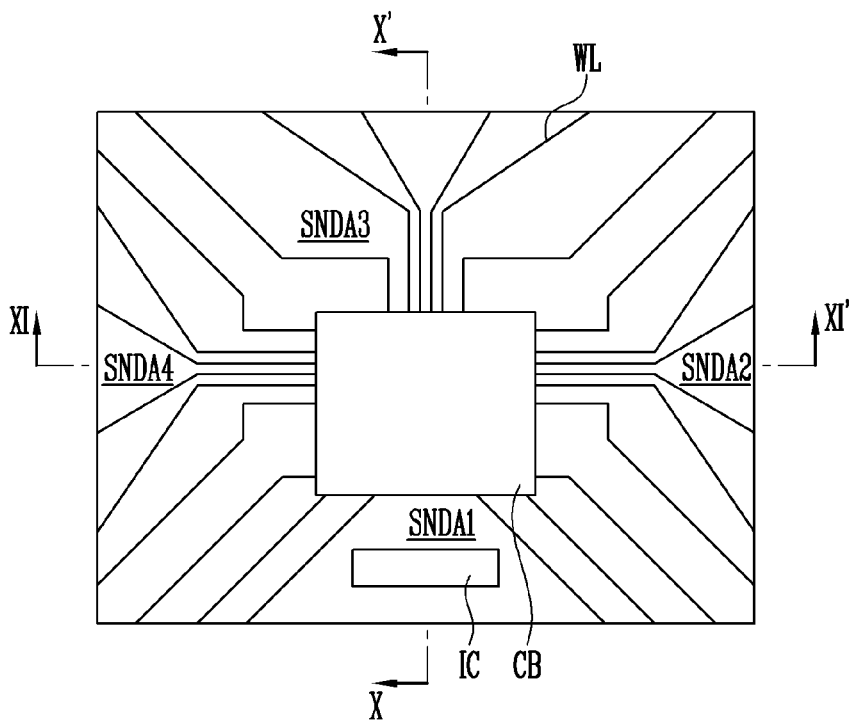
FIG. 28 is a bottom view illustrating that a non-display region is bent in the display device of FIG. 27.
Figure 29:
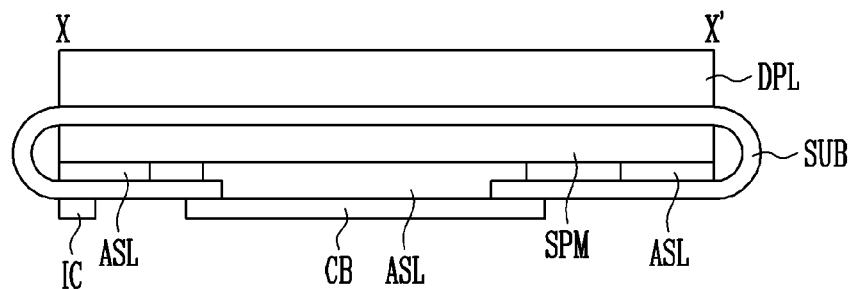
FIG. 29 is a cross-sectional view taken along line X-X' of FIG. 28.
Figure 30:
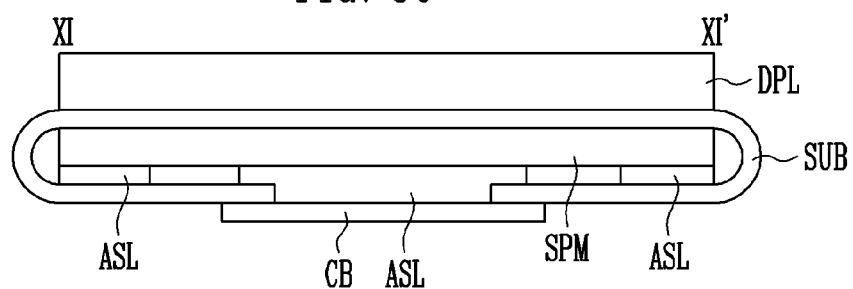
FIG. 30 is a cross-sectional view taken along line XI-XI' of FIG. 28.

FIG. 27 is a plan view illustrating a display device according to another exemplary embodiment of the invention. FIG. 28 is a bottom view illustrating that a non-display region is bent in the display device of FIG. 27. FIG. 29 is a cross-sectional view taken along line X-X' of FIG. 28. FIG. 30 is a cross-sectional view taken along line XI-XI' of FIG. 28.

Referring to FIGS. 27 to 30, the display device may include a substrate including a display region DA and a non-display region NDA, a display layer DPL disposed in the display region DA on the substrate SUB, wiring lines WL disposed in the non-display region NDA on the substrate SUB to supply a signal to the display layer DPL, a circuit board CB electrically connected to the wiring lines WL, and a supporting member SPM for supporting the substrate SUB and the circuit board CB when the non-display region NDA is bent.

The display region DA may have various shapes. According to the illustrated exemplary embodiment, the display region DA may be a quadrangle including four straight linear sides, for example.

The non-display region NDA may be adjacent to the display region DA. The non-display region NDA may include a plurality of sub-non-display regions SNDA1, SNDA2, SNDA3, and SNDA4 that respectively contact the sides of the display region DA. The sub-non-display regions SNDA1, SNDA2, SNDA3, and SNDA4 are bent and may be disposed on a surface, that is, a non-emission surface, opposite to a surface on which the display layer DPL of the substrate SUB is disposed. In addition, the sub-non-display regions SNDA1, SNDA2, SNDA3, and SNDA4 may be directly connected to the circuit board CB.

Each of the sub-non-display regions SNDA1, SNDA2, SNDA3, and SNDA4 may include each of display connection regions DCA1, DCA2, DCA3, and DCA4 that contact the display region DA. In an exemplary embodiment, each of the display connection regions DCA1, DCA2, DCA3, and DCA4 may be a quadrangle including four straight linear sides, for example.

The wiring liens WL may be provided in the display connection regions DCA1, DCA2, DCA3, and DCA4. Parts of the wiring lines WL may supply power to the pixels 140 (refer to FIG. 1). Here, the power may be one of the first pixel power ELVDD and the second pixel power ELVSS (refer to FIG. 1). The remaining wiring lines WL may transmit the pixel power to the other sub-non-display regions SNDA1, SNDA2, SNDA3, and SNDA4.

In addition, each of parts of the sub-non-display regions SNDA1, SNDA2, SNDA3, and SNDA4, for example, the second sub-non-display region SNDA2, the third sub-non-display region SNDA3, and the fourth sub-non-display region SNDA4 may further include at least one extension region NDCA2, NDCA3, or NDCA4 extending from each of parts of the display connection regions DCA2, DCA3, and DCA4. Connection terminals ECT2, ECT3, and ECT4 connected to the wiring lines WL may be respectively provided in the extension regions NDCA2, NDCA3, and NDCA4.

The extension regions NDCA2, NDCA3, and NDCA4 of the second sub-non-display region SNDA2, the third sub-non-display region SNDA3, and the fourth sub-non-display region SNDA4 are connected to the circuit board CB and may receive at least one of the first pixel power ELVDD and the second pixel power ELVSS through the connection terminals ECT2, ECT3, and ECT4. Therefore, all the wiring lines WL of the sub-non-display regions SNDA1, SNDA2, SNDA3, and SNDA4 may be electrically connected to the circuit board CB that applies at least one of the first pixel power ELVDD and the second pixel power ELVSS.

Since the pixels 140 receive at least one of the first pixel power ELVDD and the second pixel power ELVSS through the wiring lines, the pixels 140 may uniformly receive at least one of the first pixel power ELVDD and the second pixel power ELVSS in all directions of the display region DA. Therefore, the display device may prevent picture quality from deteriorating due to voltage drops of the first pixel power ELVDD and the second pixel power ELVSS.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention as set forth in the following claims.

What is claimed is:

1. A display device comprising:
   an unitary substrate including a display region and a non-display region including a plurality of sub-non-display regions that are extended from each of all sides of the display region;
   a display layer provided on a surface of the unitary substrate in the display region and including a plurality of pixels;
   wiring lines provided in the plurality of sub-non-display regions on the unitary substrate and electrically connected to the plurality of pixels;
   a circuit board which is connected to at least one of the plurality of sub-non-display regions and applies a signal to the wiring lines;
   a supporting member disposed between the unitary substrate and the circuit board such that the display layer, the unitary substrate and the supporting member overlap each other, the supporting member not including pixels; and
   an adhesive layer including opposite surfaces respectively and directly contacting the circuit board and the supporting member such that the supporting member supports the unitary substrate and the circuit board when the non-display region is bent,
   wherein the plurality of sub-non-display regions each comprises:
      a display connection region connected to the display region;
      at least one extension region extended from a part of the display connection region; and
      a corresponding wiring line of the wiring lines,
   wherein the circuit board is electrically and commonly connected to the wiring lines of each of the plurality of sub-non-display regions and the signal is commonly applied to each of all sides of the display region and directly applied to the display region by the plurality of sub-non-display regions through the wiring lines,
   wherein the plurality of sub-non-display regions are bent and face a surface opposite to a surface, on which the display layer is disposed, in the display region,
   wherein as the plurality of sub-non-display regions is bent, the extension region of one of the plurality of sub-non-display regions overlaps the extension region of another of the plurality of sub-non-display regions adjacent to the one of the plurality of sub-non-display regions, and
   wherein as the plurality of sub-non-display regions is bent, all of the wiring lines of the sub-non-display regions are electrically connected to each other and to the circuit board.

2. The display device of claim 1, wherein the substrate has a first surface and second surface facing the first surface, and the display layer and the wiring lines are provided on the first surface.

3. The display device of claim 2, wherein as the plurality of sub-non-display regions is bent, the second surface of the plurality of sub-non-display regions face the second surface of the display region.

4. The display device of claim 2, wherein the display connection region has a trapezoid that includes two lines parallel to each other and two inclined lines connecting ends of the two lines.

5. The display device of claim 4, wherein a width of a region close to the display region is larger than a width of a region far from the display region in the display connection region.

6. The display device of claim 4, wherein a sum of inclined angles of two inclined lines of the display connection regions is equal to or less than 90°.

7. The display device of claim 4, wherein as the plurality of sub-non-display regions is bent, a sum of an inclined angle of one of two inclined lines of one of the display connection regions and an inclined angle of another of two inclined lines of another of the display connection regions adjacent to the one of the display connection regions is equal to or less than 90°.

8. The display device of claim 4, wherein as the plurality of sub-non-display regions is bent, the display connection region of the one of the plurality of sub-non-display regions does not overlap the display connection region of the another of the plurality of sub-non-display regions adjacent to the one of the plurality of sub-non-display regions.

9. The display device of claim 2, further comprising a connection terminal provided in the extension region and electrically connected to the wiring lines.

10. The display device of claim 9, wherein the plurality of sub-non-display regions each comprises two extension regions separated from each other.

11. The display device of claim 10, wherein the connection terminal of the extension region of overlapping extension regions faces and is electrically connected to the connection terminal of the another extension region of the overlapping extension regions.

12. The display device of claim 11,
   wherein the connection terminal of the extension region is provided on a surface, on which the wiring lines are disposed, of the unitary substrate, and wherein the connection terminal of the another extension region is provided on a surface opposite to the surface, on which the wiring lines are disposed, of the unitary substrate.

13. The display device of claim 12, wherein the connection terminal of the another extension region is electrically connected to the wiring lines through a contact hole which passes through the unitary substrate.

14. The display device of claim 11,
wherein the connection terminal of each of the overlapping extension regions is provided on a surface, on which the wiring lines are disposed, of the unitary substrate,
wherein the extension region is bent, and
wherein the connection terminal of the extension region faces and is electrically connected to the connection terminal of another extension region.

15. The display device of claim 11,
wherein the extension region comprises a housing covering the connection terminal and providing an internal space, and
wherein the another extension region is inserted into the internal space.

16. The display device of claim 11, further comprising a conductive member disposed among the connection terminals and including one of an anisotropic conductive film and an anisotropic conductive adhesive.

17. The display device of claim 11, wherein wiring lines of the plurality of sub-non-display regions adjacent to each other are electrically connected.

18. The display device of claim 1, wherein the signal is pixel power supplied to the plurality of pixels.

19. A display device comprising:
an unitary substrate including a display region and a non-display region including a plurality of sub-non-display regions that are extended from each of all sides of the display region;
a display layer provided on a surface of the unitary substrate in the display region and including a plurality of pixels;
wiring lines provided in the plurality of sub-non-display regions on the unitary substrate and electrically connected to the plurality of pixels;
a circuit board which is connected to at least one of the plurality of sub-non-display regions and applies a signal to the wiring lines;
a supporting member disposed between the unitary substrate and the circuit board such that the display layer, the unitary substrate and the supporting member overlap each other, the supporting member not including pixels; and
an adhesive layer including opposite surfaces respectively and directly contacting the circuit board and the supporting member such that the supporting member supports the unitary substrate and the circuit board when the non-display region is bent,
wherein the plurality of sub-non-display regions each comprises:
a display connection region connected to the display region;
at least one extension region extended from a part of the display connection region; and
a corresponding wiring line of the wiring lines,
wherein the circuit board is electrically and commonly connected to the wiring lines of each of the plurality of sub-non-display regions and the signal is commonly applied to each of all sides of the display region and directly applied to the display region by the plurality of sub-non-display regions through the wiring lines,
wherein the plurality of sub-non-display regions are bent and face a surface opposite to a surface, on which the display layer is disposed, in the display region, and
wherein as the plurality of sub-non-display regions is bent, the wiring lines are electrically connected, and
wherein as the plurality of sub-non-display regions is bent, all of the wiring lines of the sub-non-display regions are electrically connected to each other and to the circuit board.

20. The display device of claim 19, wherein the substrate has a first surface and second surface facing the first surface, and the display layer and the wiring lines are provided on the first surface.

21. The display device of claim 20, wherein as the plurality of sub-non-display regions is bent, the wiring lines face the second surface.

22. The display device of claim 20, wherein the display connection region has a trapezoid that includes two lines parallel to each other and two inclined lines connecting ends of the two lines.

23. The display device of claim 22, wherein a width of a region close to the display region is larger than a width of a region far from the display region in the display connection region.

24. The display device of claim 22, wherein a sum of inclined angles of two inclined lines of the display connection regions is equal to or less than 90°.

25. The display device of claim 22, wherein as the plurality of sub-non-display regions is bent, a sum of an inclined angle of one of two inclined lines of the one of the plurality of sub-non-display regions and an inclined angle of another of two inclined lines of another of the plurality of sub-non-display regions adjacent to the one of the plurality of sub-non-display regions is equal to or less than 90°.

26. The display device of claim 22, wherein when the plurality of sub-non-display regions is bent, the display connection region of the one of the plurality of sub-non-display regions does not overlap the display connection region of the another of the plurality of sub-non-display regions adjacent to the one of the plurality of sub-non-display regions.

27. The display device of claim 20, further comprising a connection terminal provided in the extension region and electrically connected to the wiring lines.

28. The display device of claim 27, wherein the display connection region is a quadrangle including one side contacting the display region.

29. The display device of claim 28, wherein the extension region extends from a side which faces the one side of the display connection region.

30. The display device of claim 29, wherein the connection terminal is directly connected to the circuit board.

31. The display device of claim 29, wherein the plurality of sub-non-display regions each comprises two extension regions separated from each other.

32. The display device of claim 31,
Wherein as the plurality of sub-non-display regions is bent, an extension region of one of the plurality of sub-non-display regions overlaps another extension region of another of the plurality of sub-non-display regions adjacent to the one of the plurality of sub-non-display regions, and wherein the connection terminal of an extension region of one of overlapping extension regions is electrically connected to a connection terminal of the another extension region.

33. The display device of claim 32,
wherein the connection terminal of the extension region is provided on a surface, on which the wiring lines are disposed, of the unitary substrate, and
wherein the connection terminal of the another extension region is provided on a surface opposite to the surface, on which the wiring lines are disposed, of the unitary substrate.

34. The display device of claim 33, wherein the connection terminal of the another extension region is electrically connected to the wiring lines through a contact hole which passes through the unitary substrate.

35. The display device of claim 32,
wherein the connection terminal of each of the overlapping extension regions is provided on a surface, on which the wiring lines are disposed, of the unitary substrate,
wherein the extension region is bent, and
wherein the connection terminal of the extension region faces and is electrically connected to the connection terminal of the another extension region.

36. The display device of claim 32,
wherein the extension region comprises a housing covering the connection terminal and providing an internal space, and
wherein the another extension region is inserted into the internal space.

37. The display device of claim 32, further comprising a conductive member disposed among the connection terminals and including one of an anisotropic conductive film and an anisotropic conductive adhesive.

38. The display device of claim 32, wherein wiring lines of the plurality of sub-non-display regions adjacent to each other are electrically connected.

39. The display device of claim 28, wherein each of the plurality of sub-non-display regions comprises two extension regions respectively extending from sides contacting both ends of the one side of the display connection region.

40. The display device of claim 39,
wherein as the plurality of sub-non-display regions is bent, an extension region of one of the plurality of sub-non-display regions overlaps another extension region of another of the plurality of sub-non-display regions adjacent to the one of the plurality of sub-non-display regions, and
wherein the connection terminal of the extension region is electrically connected to a connection terminal of the another extension region.

41. The display device of claim 40,
wherein the connection terminal of the extension region is provided on a surface, on which the wiring lines are disposed, of the unitary substrate, and
wherein the connection terminal of the another extension region is provided on a surface opposite to the surface, on which the wiring lines are disposed, of the unitary substrate.

42. The display device of claim 41, wherein the connection terminal of the another extension region is electrically connected to the wiring lines through a contact hole which passes through the unitary substrate.

43. The display device of claim 40,
wherein the extension region comprises a housing covering the connection terminal and providing an internal space, and
wherein the another extension region is inserted into the internal space.

44. The display device of claim 40, further comprising a conductive member disposed among the connection terminals and including one of an anisotropic conductive film and an anisotropic conductive adhesive.

45. The display device of claim 40, wherein wiring lines of the plurality of sub-non-display regions adjacent to each other are electrically connected.

46. The display device of claim 28,
wherein the display region is a quadrangle,
wherein the non-display region comprises a first sub-non-display region, a second sub-non-display region, a third sub-non-display region, and a fourth sub-non-display region respectively extending from sides of the display region,
wherein the first sub-non-display region comprises two extension regions connected to the circuit board and respectively extending from sides contacting both ends of the one side of the display connection region,
wherein the third sub-non-display region comprises at least one extension region facing the first sub-non-display region, extending from a side facing the one side of the display connection region connected to the circuit board, and connected to the circuit board.

47. The display device of claim 46, wherein as the plurality of sub-non-display regions is bent, the second sub-non-display region and the fourth sub-non-display region overlap one of the extension regions of the first sub-non-display region.

48. The display device of claim 20, wherein the signal is pixel power supplied to the plurality of pixels.

* * * * *